United States Patent
Colinge et al.

(10) Patent No.: US 8,999,805 B1
(45) Date of Patent: Apr. 7, 2015

(54) SEMICONDUCTOR DEVICE WITH REDUCED GATE LENGTH

(71) Applicant: Taiwan Semiconductor Manufacturing Company Limited, Hsin-Chu (TW)

(72) Inventors: Jean-Pierre Colinge, Hsinchu (TW); Kuo-Cheng Ching, Zhubei (TW); Ta-Pen Guo, Cupertino, CA (US); Carlos H. Diaz, Mountain View, CA (US)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/046,960

(22) Filed: Oct. 5, 2013

(51) Int. Cl.
  *H01L 21/331* (2006.01)
  *H01L 21/8222* (2006.01)
  *H01L 29/78* (2006.01)
  *H01L 29/66* (2006.01)

(52) U.S. Cl.
  CPC ...... *H01L 29/7827* (2013.01); *H01L 29/66666* (2013.01)

(58) Field of Classification Search
  USPC ......... 438/311, 680, 752, 753, 762, 700, 786, 438/787, 791, 782; 257/347, 396, E21.006, 257/E21.045, E21.056, E21.061, E21.092, 257/E21.121, E21.123, E21.129, E21.126, 257/E21.127, E21.17, E21.231, E21.267, 257/E21.293, E21.32
  See application file for complete search history.

(56) References Cited

U.S. PATENT DOCUMENTS

| 8,093,664 | B2 * | 1/2012 | Gomikawa et al. | 257/403 |
| 8,319,316 | B2 * | 11/2012 | Kutsukake et al. | 257/611 |
| 8,395,197 | B2 * | 3/2013 | Nagai | 257/296 |
| 8,633,075 | B2 * | 1/2014 | Shima | 438/276 |
| 8,653,570 | B2 * | 2/2014 | Konishi | 257/292 |
| 8,716,774 | B2 * | 5/2014 | Mikasa | 257/296 |

OTHER PUBLICATIONS

Sakui, et al., "A new vertical MOSFET "Vertical Logic Circuit (VLC) MOSFET" suppressing asymmetric characteristics and realizing an ultra compact and robust logic circuit", Solid-State Electronics 54 (2010) 1457-1462, www.elsevier.com/locate/sse.

Sun, et al., "Demonstration of Memory String with Stacked Junction-Less SONOS Realized on Vertical Silicon Nanowire", 2011, pp. 1-4, http://ieeexplore.ieee.org/xpl/login.jsp?tp=&arnumber=6131524&url=http%3A%2F%2Fieeexplore.ieee.org%2Fxpls%2Fabs_all.jsp%3Farnumber%3D6131524.

Hamedi_Hagh, et al., "Design of Next Generation Amplifiers Using Nanowire FETs", Journal of Electrical Engineering & Technology, vol. 3, No. 4, pp. 566-570, 2008.

Bindal, et al., "Exploratory study on power-efficient silicon nanowire dynamic NMOSFET/PMESFET logic", IET Sci. Meas. Technol., 2007, 1, (2), pp. 121-130.

(Continued)

*Primary Examiner* — David Nhu
(74) *Attorney, Agent, or Firm* — Cooper Legal Group, LLC

(57) ABSTRACT

A semiconductor device includes a first type region including a first conductivity type. The semiconductor device includes a second type region including a second conductivity type. The semiconductor device includes a channel region extending between the first type region and the second type region. The semiconductor device includes a gate region surrounding the channel region. The gate region includes a gate electrode. A gate electrode length of the gate electrode is less than about 10 nm. A method of forming a semiconductor device is provided.

20 Claims, 26 Drawing Sheets

(56) References Cited

OTHER PUBLICATIONS

Sleight, et al., "Gate-All-Around Silicon Nanowire MOSFETs and Circuits", 2010, pp. 269-272, http://ieeexplore.ieee.org/xpl/login.jsp?tp=&arnumber=5551965&url=http%3A%2F%2Fieeexplore.ieee.org%2Fxpls%2Fabs_all.jsp%3Farnumber%3D5551965.

Sun, et al., "Junction-Less Stackable SONOS Memory Realized on Vertical-Si-Nanowire for 3-D Application", 2011, pp. 1-2, Published in: VLSI Technology, Systems and Applications (VLSI-TSA), 2011 International Symposium, Apr. 25-27, 2011, http://ieeexplore.ieee.org/xpl/login.jsp?tp=&arnumber=5872271&url=http%3A%2F%2Fieeexplore.ieee.org%2Fxpls%2Fabs_all.jsp%3Farnumber%3D5872271.

Sun, et al., "Junctionless Vertical-Si-Nanowire-Channel-Based SONOS Memory With 2-Bit Storage per Cell", IEEE Electron Device Letters, vol. 32, No. 6, Jun. 2011, pp. 725-727.

Samedi-Hagh, et al., "Spice Modeling of Silicon Nanowire Field-Effect Transistors for High-Speed Analog Integrated Circuits", IEEE Transactions on Nanotechnology, vol. 7, No. 6, Nov. 2008, pp. 766-775.

Bindal, et al., "The Design of Dual Work Function CMOS Transistors and Circuits Using Silicon Nanowire Technology", IEEE Transactions on Nanotechnology, vol. 6, No. 3, May 2007, pp. 291-302.

* cited by examiner

SEMICONDUCTOR DEVICE WITH REDUCED GATE LENGTH

BACKGROUND

In a semiconductor device, current flows through a channel region between a source region and a drain region upon application of a sufficient voltage or bias to a gate of the device. When current flows through the channel region, the device is generally regarded as being in an 'on' state, and when current is not flowing through the channel region, the device is generally regarded as being in an 'off' state.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
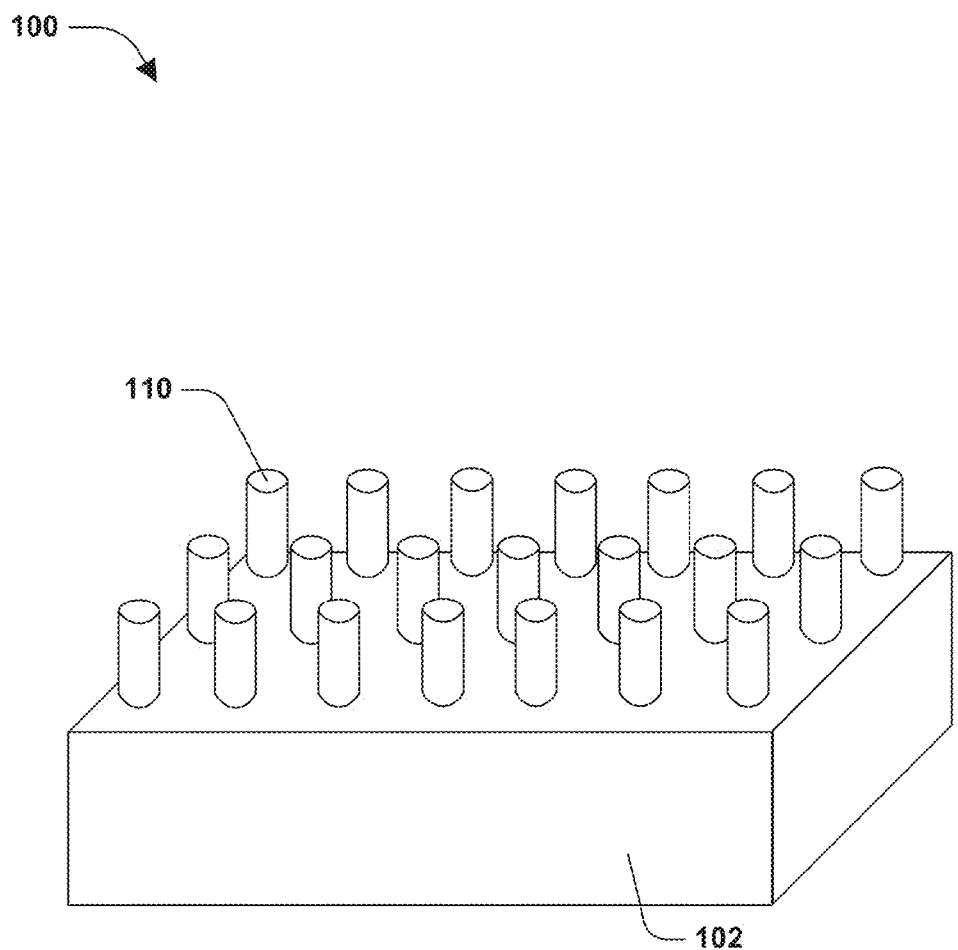
FIG. 1 illustrates a portion of a semiconductor device, according to an embodiment.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor device and resulting structures formed thereby are provided herein.

FIG. 1 is a perspective view illustrating a portion of a semiconductor device 100 according to some embodiments. In an embodiment, the semiconductor device 100 is formed upon a substrate region 102. The substrate region 102 comprises any number of materials, such as, for example, silicon, polysilicon, germanium, etc., alone or in combination. According to some embodiments, the substrate region 102 comprises an epitaxial layer, a silicon-on-insulator (SOI) structure, a wafer, or a die formed from a wafer, etc.

In an embodiment, the semiconductor device 100 comprises one or more vertical nanowires 110. According to some embodiments, the vertical nanowires 110 project from the substrate region 102. The vertical nanowires 110 comprise any number of materials such as, for example, silicon, polysilicon, germanium, etc., alone or in combination. The vertical nanowires 110 are formed in any number of ways, such as by patterning and etching, in some embodiments.

Figure 2:
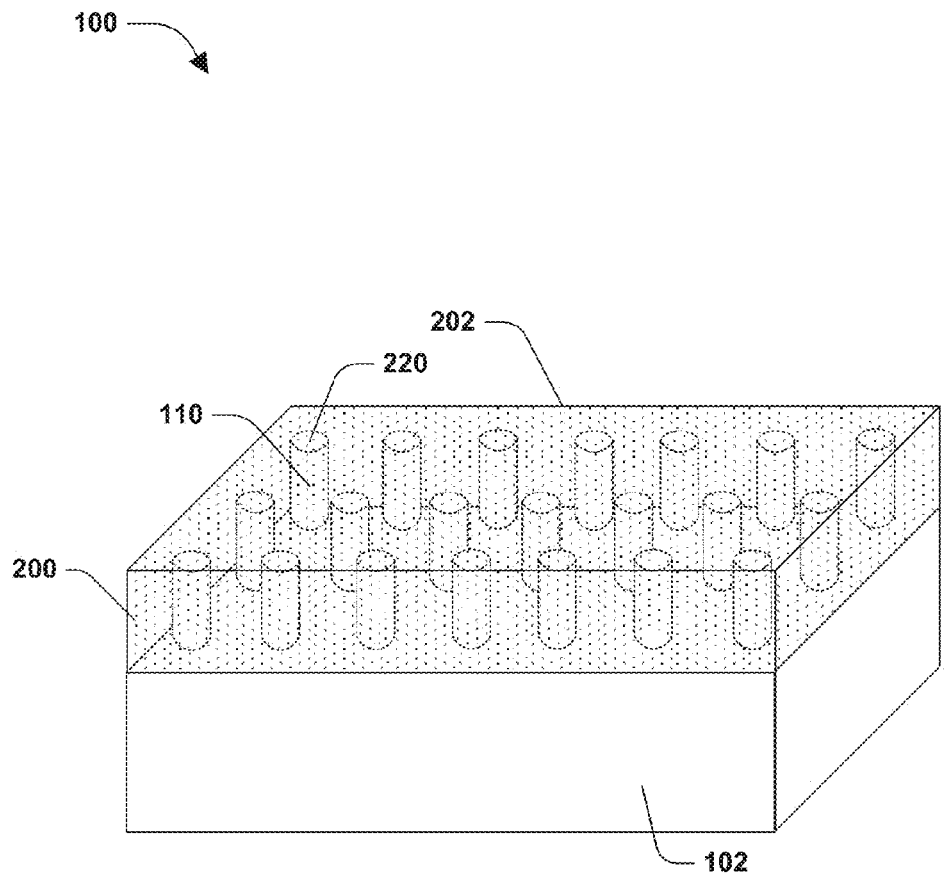
FIG. 2 illustrates a portion of a semiconductor device, according to an embodiment.

Turning to FIG. 2, in an embodiment, a first oxide region 200 is formed on the substrate region 102 surrounding the vertical nanowires 110. The first oxide region 200 is formed in any number of ways, such as by deposition, chemical vapor deposition (CVD), spin-on deposition, or other suitable methods, for example. The first oxide region 200 comprises any number of materials, including oxides, silicon oxide, nitrides, silicon nitride, oxynitrides, $SiO_2$, etc., alone or in combination. In some embodiments, the first oxide region 200 is planarized, such that a top surface 202 of the first oxide region 200 is substantially planar. In some embodiments, the top surface 202 of the first oxide region 200 is substantially co-planar with a top surface 220 of the vertical nanowires 110.

Figure 3:
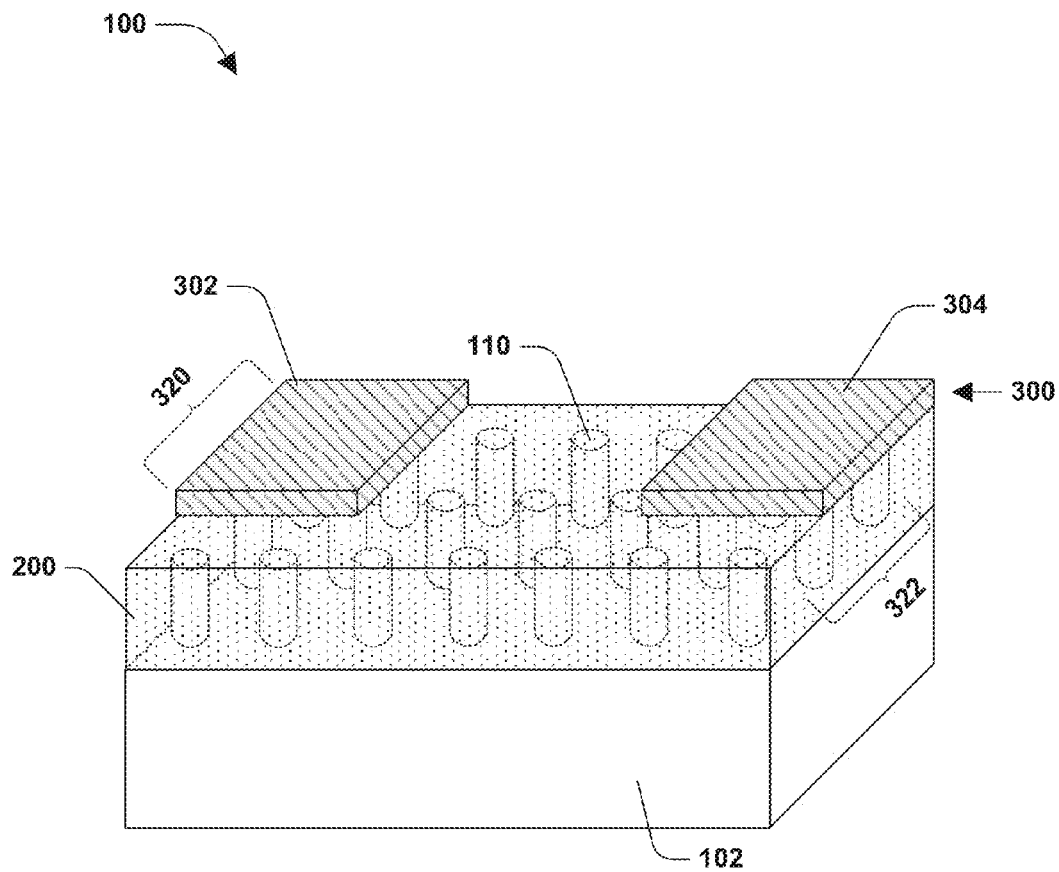
FIG. 3 illustrates a portion of a semiconductor device, according to an embodiment.

Turning to FIG. 3, according to some embodiments, a first mask region 300 is formed over the first oxide region 200. The first mask region 300 is formed in any number of ways, such as by deposition, chemical vapor deposition (CVD), or other suitable methods, for example. The first mask region 300 comprises any number of materials, including oxides, silicon oxide, nitrides, silicon nitride, $Si_3N_4$, photoresist, etc., alone or in combination.

In some embodiments, the first mask region 300 is patterned and etched to form a first mask portion 302 and a second mask portion 304. In an embodiment, the first mask portion 302 is formed over a first portion 320 of the vertical nanowires 110. In an embodiment, the first portion 320 of the vertical nanowires 110 comprises four vertical nanowires. In some embodiments, the second mask portion 304 of the first mask region 300 is formed over a second portion 322 of the vertical nanowires 110. In an embodiment, the second portion 322 of the vertical nanowires 110 comprises a number of vertical nanowires. In some embodiments, the second portion 322 of the vertical nanowires 110 comprises more than four vertical nanowires. In some embodiments, the second portion 322 of the vertical nanowires 110 comprises fewer than four vertical nanowires.

Figure 4:
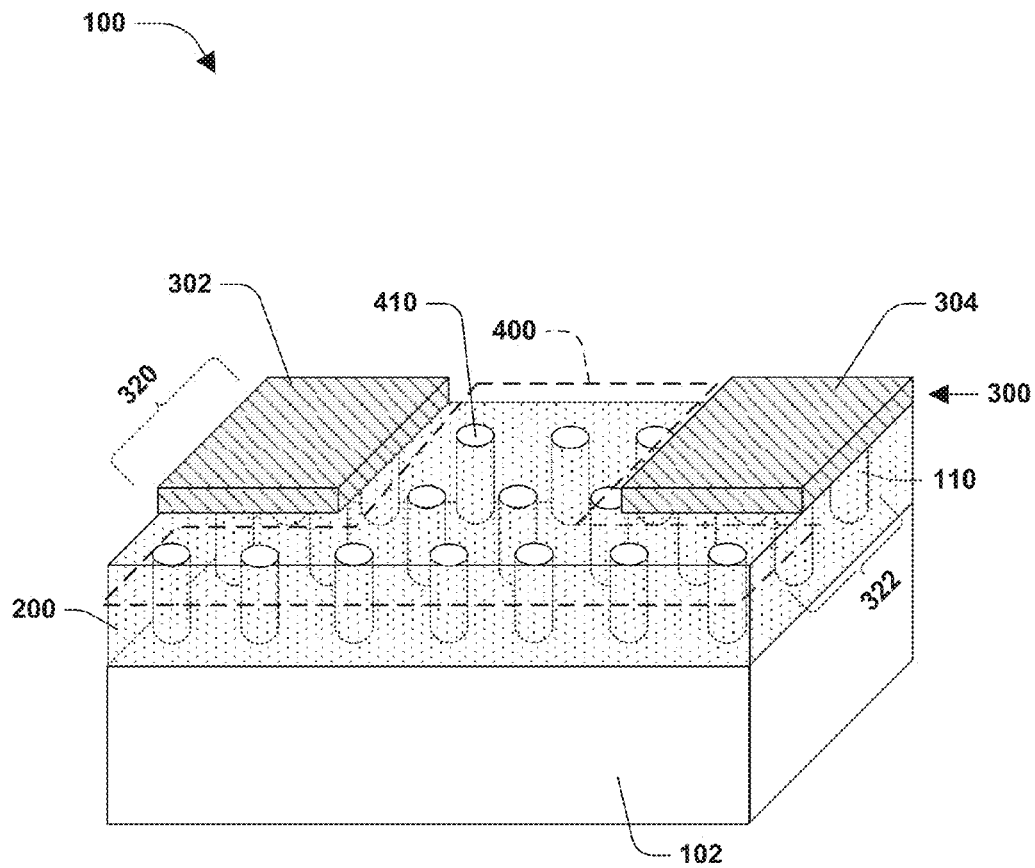
FIG. 4 illustrates a portion of a semiconductor device, according to an embodiment.

Turning to FIG. 4, according to some embodiments, a third portion 400 of the of the vertical nanowires 110 that is not covered by the first mask portion 302 or the second mask portion 304 of the first mask region 300 is removed. In an embodiment, the third portion 400 of the vertical nanowires 110 comprises the vertical nanowires 110 that are not comprised as part of the first portion 320 or the second portion 322. The third portion 400 of the vertical nanowires 110 is removed in any number of ways, such as by etching, for example. In some embodiments, the third portion 400 of the vertical nanowires 110 are removed by etching while the first portion 320 and the second portion 322 of the vertical nanowires 110, located underneath the first mask portion 302 and second mask portion 304, respectively, are not removed. In an embodiment, following the removal of the third portion 400 of the vertical nanowires 110, one or more recesses 410 extend through or exist within the first oxide region 200 at the previous locations of the third portion 400 of the vertical nanowires 110.

Figure 5:
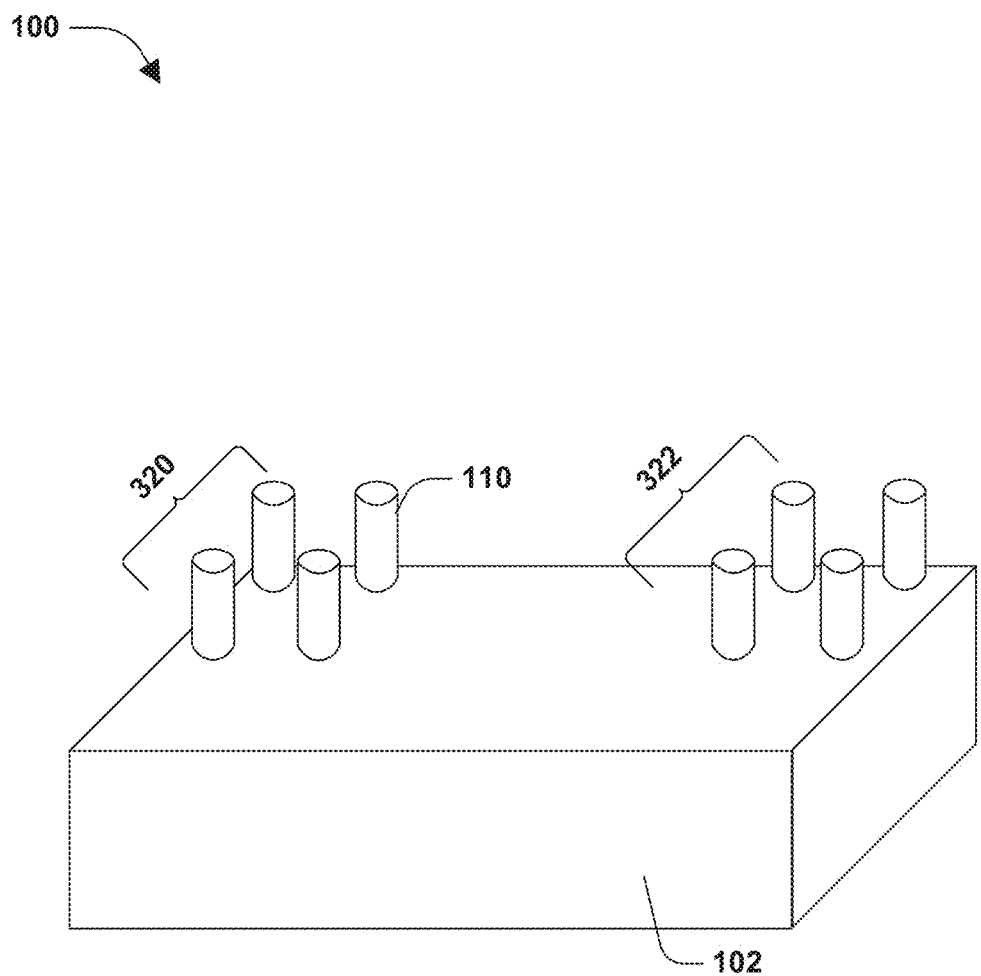
FIG. 5 illustrates a portion of a semiconductor device, according to an embodiment.

Turning to FIG. 5, according to some embodiments, the first mask portion 302 and second mask portion 304 of the first mask region 300 are removed, such as by etching, for example. In some embodiments, the first oxide region 200 is removed, such as by etching. Following removal of the first mask portion 302, second mask portion 304, and first oxide region 200, the first portion 320 and the second portion 322 of the vertical nanowires 110 are substantially uncovered.

Figure 6:
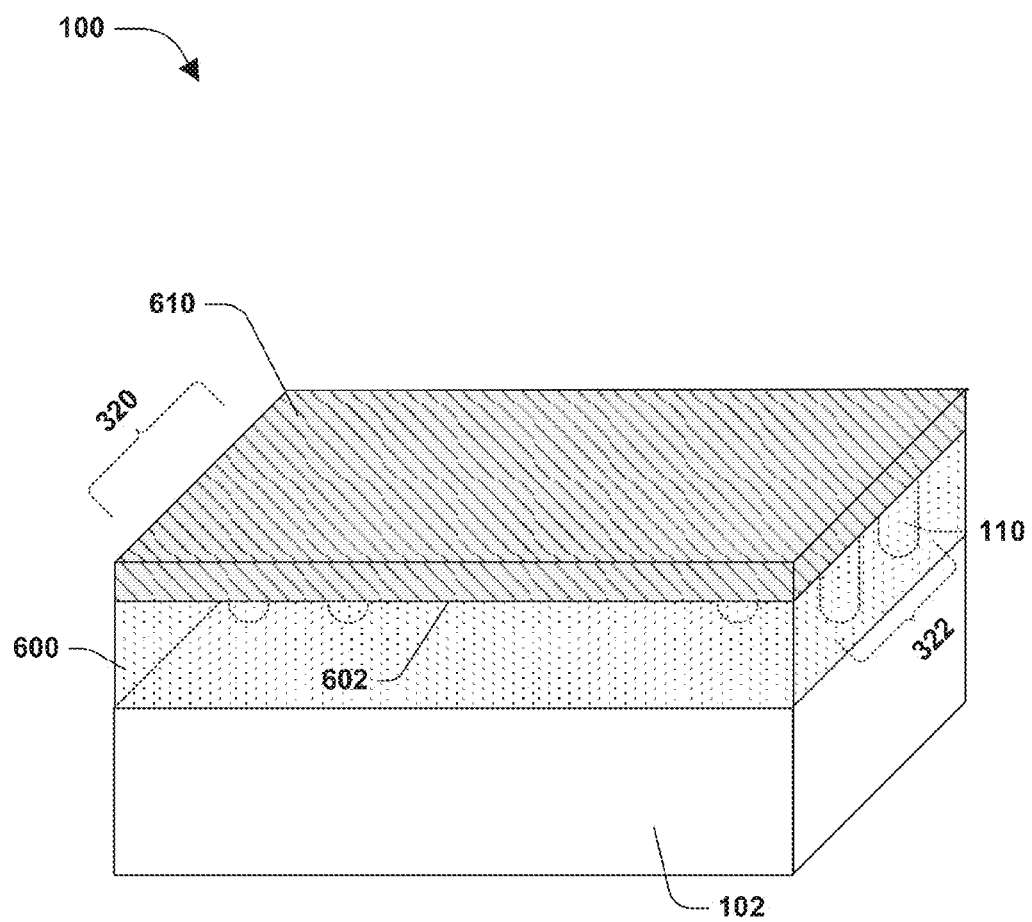
FIG. 6 illustrates a portion of a semiconductor device, according to an embodiment.

Turning to FIG. 6, according to some embodiments, a second oxide region 600 is formed on the substrate region 102 surrounding the first portion 320 and the second portion 322 of the vertical nanowires 110. The second oxide region 600 is formed in any number of ways, such as by deposition, chemical vapor deposition (CVD), spin-on deposition, or other suitable methods, for example. The second oxide region 600 comprises any number of materials, including oxides, silicon oxide, nitrides, silicon nitride, oxynitrides, $SiO_2$, etc., alone or in combination. In some embodiments, the second oxide region 600 is planarized, such that a top surface 602 of the second oxide region 600 is substantially planar. In some embodiments, the top surface 602 of the second oxide region 600 is substantially co-planar with the top surface 220 (e.g., illustrated in FIG. 2) of the vertical nanowires 110.

According to some embodiments, a second mask region 610 is formed over the second oxide region 600. The second mask region 610 is formed in any number of ways, such as by deposition, chemical vapor deposition (CVD), or other suitable methods, for example. The second mask region 610 comprises any number of materials, including oxides, silicon oxide, nitrides, silicon nitride, $Si_3N_4$, etc., alone or in combination.

Figure 7:
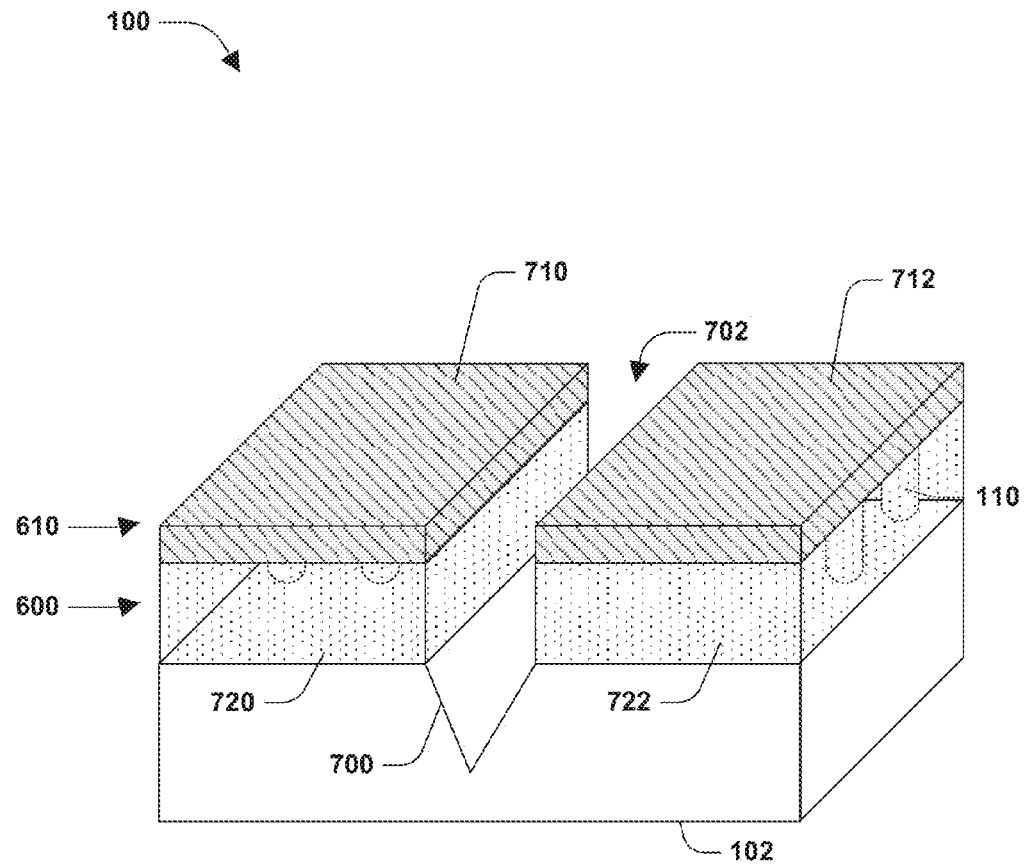
FIG. 7 illustrates a portion of a semiconductor device, according to an embodiment.

Turning to FIG. 7, according to some embodiments, a shallow trench isolation (STI) region 700 is formed within the substrate region 102. In some embodiments, the STI region 700 defines an opening 702 that extends through the second mask region 610 and the second oxide region 600 and into the substrate region 102. The STI region is formed in any number of ways, such as by etching, for example. In an embodiment, the opening 702 defined by the STI region 700 is located between a first portion 710 and a second portion 712 of the second mask region 610. In an embodiment, the opening 702 defined by the STI region 700 is located between a first portion 720 and a second portion 722 of the second oxide region 600.

Figure 8:
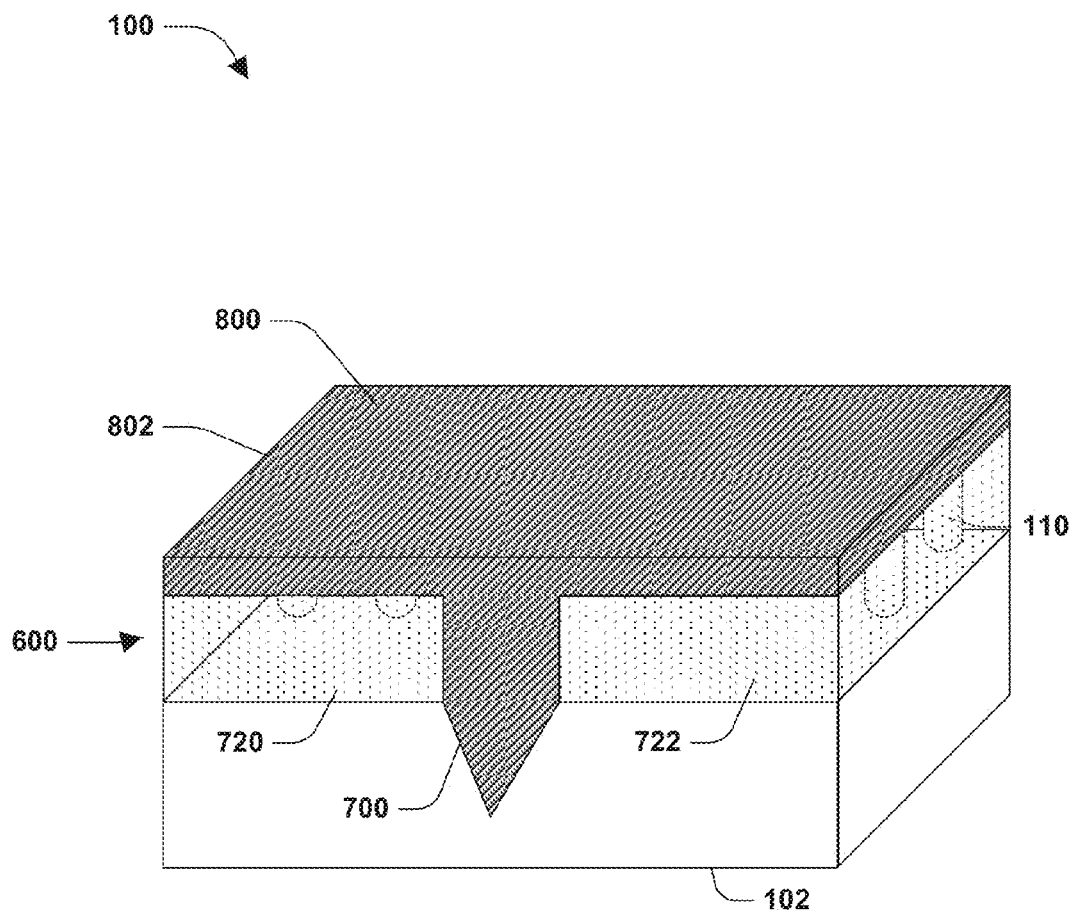
FIG. 8 illustrates a portion of a semiconductor device, according to an embodiment.

Turning to FIG. 8, in some embodiments, the first portion 710 and second portion 712 of the second mask region 610 are removed, such as by etching. According to some embodiments, a third oxide region 800 is formed within the STI region 700, opening 702, and over the first portion 720 and second portion 722 of the second oxide region 600. The third oxide region 800 is formed in any number of ways, such as by deposition, chemical vapor deposition (CVD), spin-on deposition, or other suitable methods, for example. The third oxide region 800 comprises any number of materials, including oxides, silicon oxide, nitrides, silicon nitride, oxynitrides, $SiO_2$, etc., alone or in combination. In some embodiments, the third oxide region 800 is planarized, such that a top surface 802 of the third oxide region 800 is substantially planar.

Figure 9:
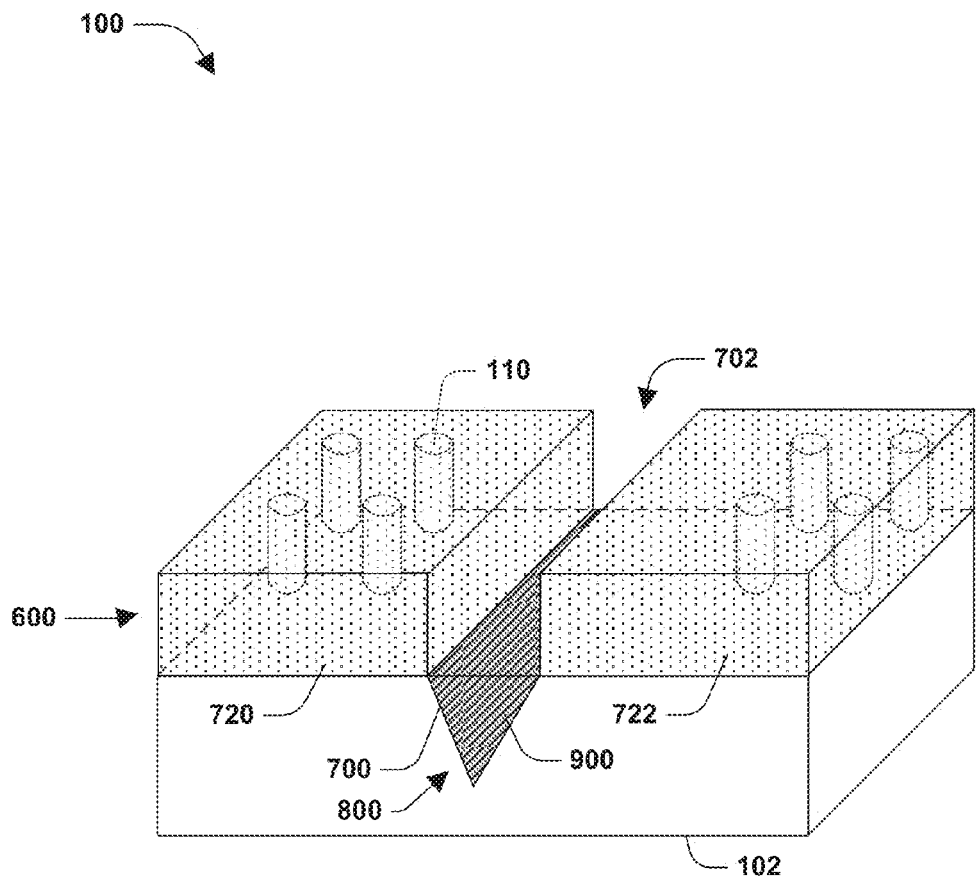
FIG. 9 illustrates a portion of a semiconductor device, according to an embodiment.

Turning to FIG. 9, in some embodiments, a portion of the third oxide region 800 is removed, such as by etching. According to some embodiments, the third oxide region 800 is removed such that a first portion 900 of the third oxide region 800 remains. In an embodiment, the first portion 900 of the third oxide region 800 is located within the STI region 700. In some embodiments, the first portion 900 of the third oxide region 800 is planarized.

Figure 10:
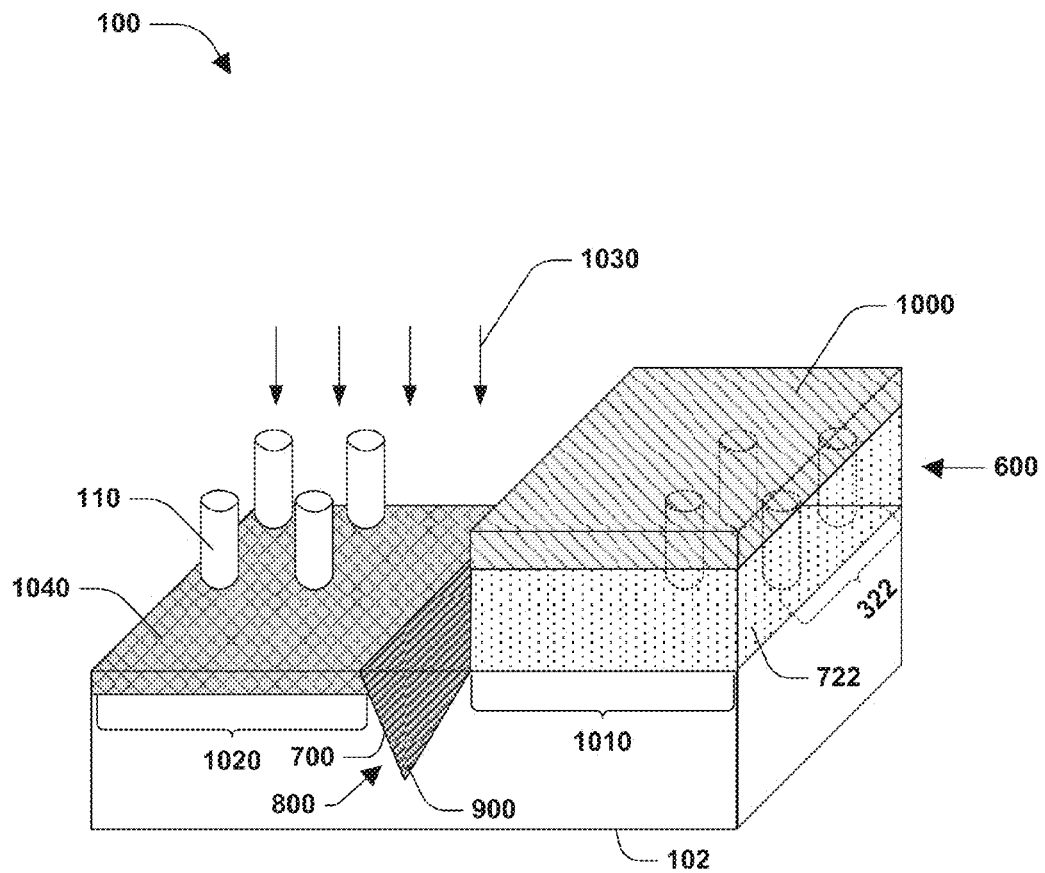
FIG. 10 illustrates a portion of a semiconductor device, according to an embodiment.

Turning to FIG. 10, in some embodiments, a third mask region 1000 is formed over the second portion 722 of the second oxide region 600. In an embodiment, the third mask region 1000 if formed over the second portion 322 of the vertical nanowires 110 and over a second portion 1010 of the substrate region 102. The third mask region 1000 is formed in any number of ways, such as by deposition, chemical vapor deposition (CVD), or other suitable methods, for example. The third mask region 1000 comprises any number of materials, including oxides, silicon oxide, nitrides, silicon nitride, $Si_3N_4$, etc., alone or in combination.

According to some embodiments, the first portion 720 (e.g., illustrated in FIG. 9) of the second oxide region 600 is removed, such as by etching. In an embodiment, following removal of the first portion 720 of the second oxide region 600, a first portion 1020 of the substrate region 102 is substantially uncovered and is doped 1030. In some embodiments, the first portion 1020 of the substrate region 102 is doped 1030 such that the first portion 1020 of the substrate region 102 comprises a first conductivity type. In some embodiments, following the doping 1030 of the first portion 1020 of the substrate region 102, a first well region 1040 is formed on or within the substrate region 102. According to some embodiment, the first conductivity type of the first well region 1040 comprises a p-type such that the first well region 1040 comprises a p-well. In some embodiments, the first conductivity type of the first well region 1040 comprises an n-type, such that the first well region 1040 comprises an n-well.

Figure 11:
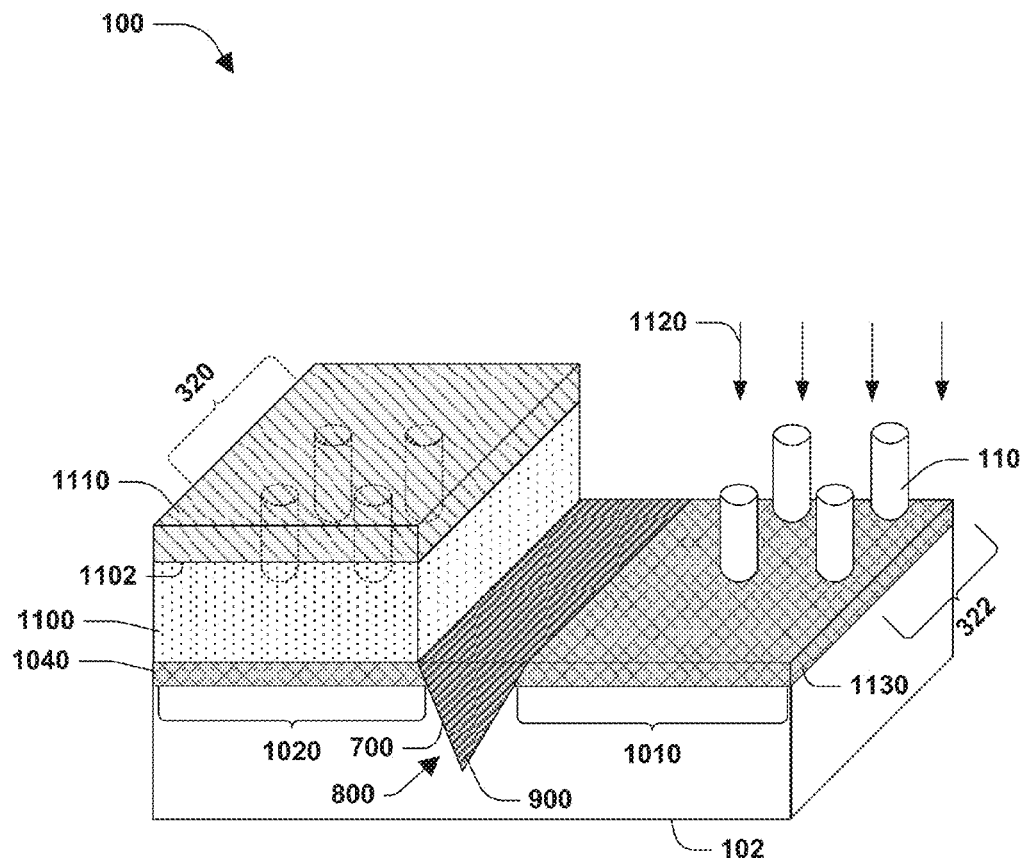
FIG. 11 illustrates a portion of a semiconductor device, according to an embodiment.

Turning to FIG. 11, in some embodiments, a fourth oxide region 1100 is formed on the first well region 1040. The fourth oxide region 1100 is formed in any number of ways, such as by deposition, chemical vapor deposition (CVD), spin-on deposition, or other suitable methods, for example. The fourth oxide region 1100 comprises any number of materials, including oxides, silicon oxide, nitrides, silicon nitride, oxynitrides, $SiO_2$, etc., alone or in combination. In some embodiments, the fourth oxide region 1100 is planarized, such that a top surface 1102 of the fourth oxide region 1100 is substantially planar.

In some embodiments, a fourth mask region 1110 is formed over the fourth oxide region 1100. In an embodiment, the fourth mask region 1110 is formed over the first portion 320 of the vertical nanowires 110 and over the first portion 1020 of the substrate region 102. The fourth mask region 1110 is formed in any number of ways, such as by deposition, chemical vapor deposition (CVD), or other suitable methods, for example. The fourth mask region 1110 comprises any number of materials, including oxides, silicon oxide, nitrides, silicon nitride, $Si_3N_4$, etc., alone or in combination.

According to some embodiments, the third mask region 1000 and the second portion 722 of the second oxide region 600 (e.g., illustrated in FIG. 10) are removed, such as by etching. In an embodiment, following removal of the second portion 722 of the second oxide region 600, the second portion 1010 of the substrate region 102 is substantially uncovered. In some embodiments, the second portion 1010 of the substrate region 102 is doped 1120 such that the second portion 1010 of the substrate region 102 comprises a second conductivity type. In some embodiments, the second conductivity type is opposite the first conductivity type. In some embodiments, following the doping 1120 of the second portion 1010 of the substrate region 102, a second well region 1130 is formed on or within the substrate region 102. According to some embodiment, the second conductivity type of the second well region 1130 comprises a p-type such that the second well region 1130 comprises a p-well. In some embodiments, the second conductivity type of the second well region 1130 comprises an n-type, such that the second well region 1130 comprises an n-well.

Figure 12:
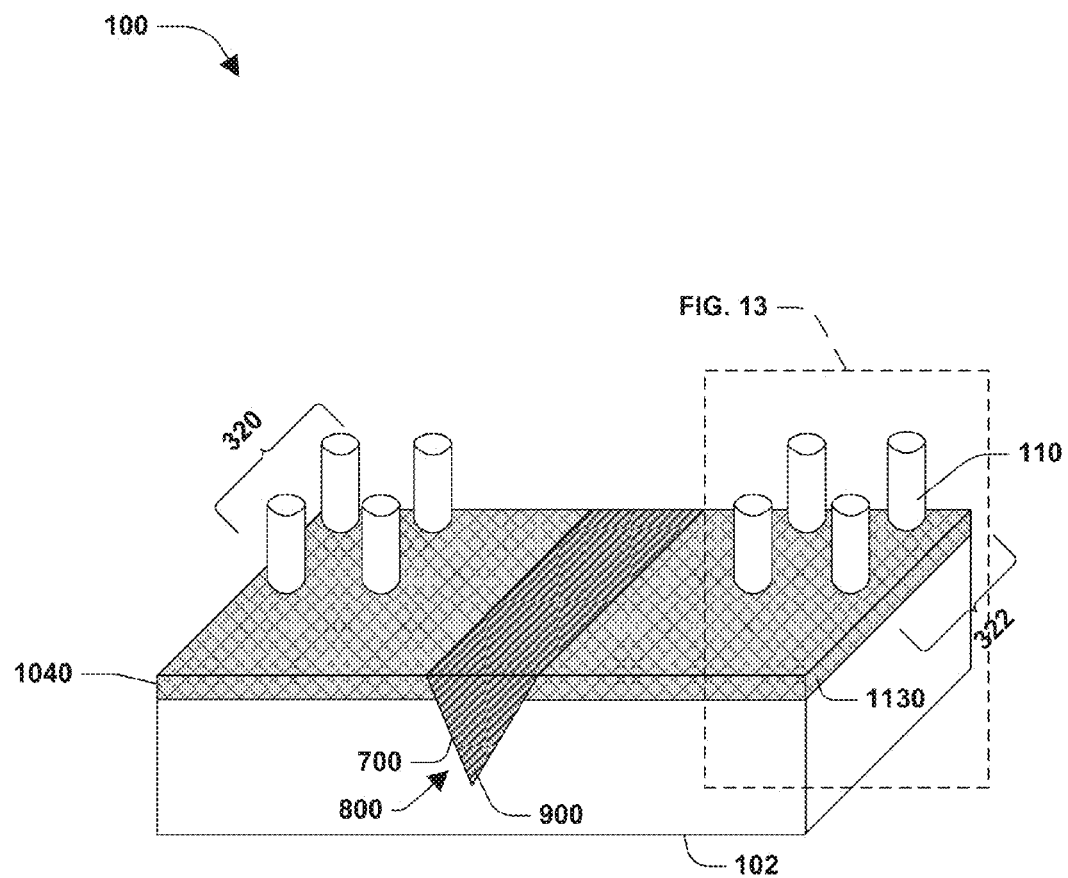
FIG. 12 illustrates a portion of a semiconductor device, according to an embodiment.

Turning to FIG. 12, according to some embodiments, the fourth oxide region 1100 and the fourth mask region 1110 are removed, such as by etching. In some embodiments, following removal of the fourth oxide region 1100 and the fourth mask region 1110, the first well region 1040 is substantially exposed.

Figure 13:
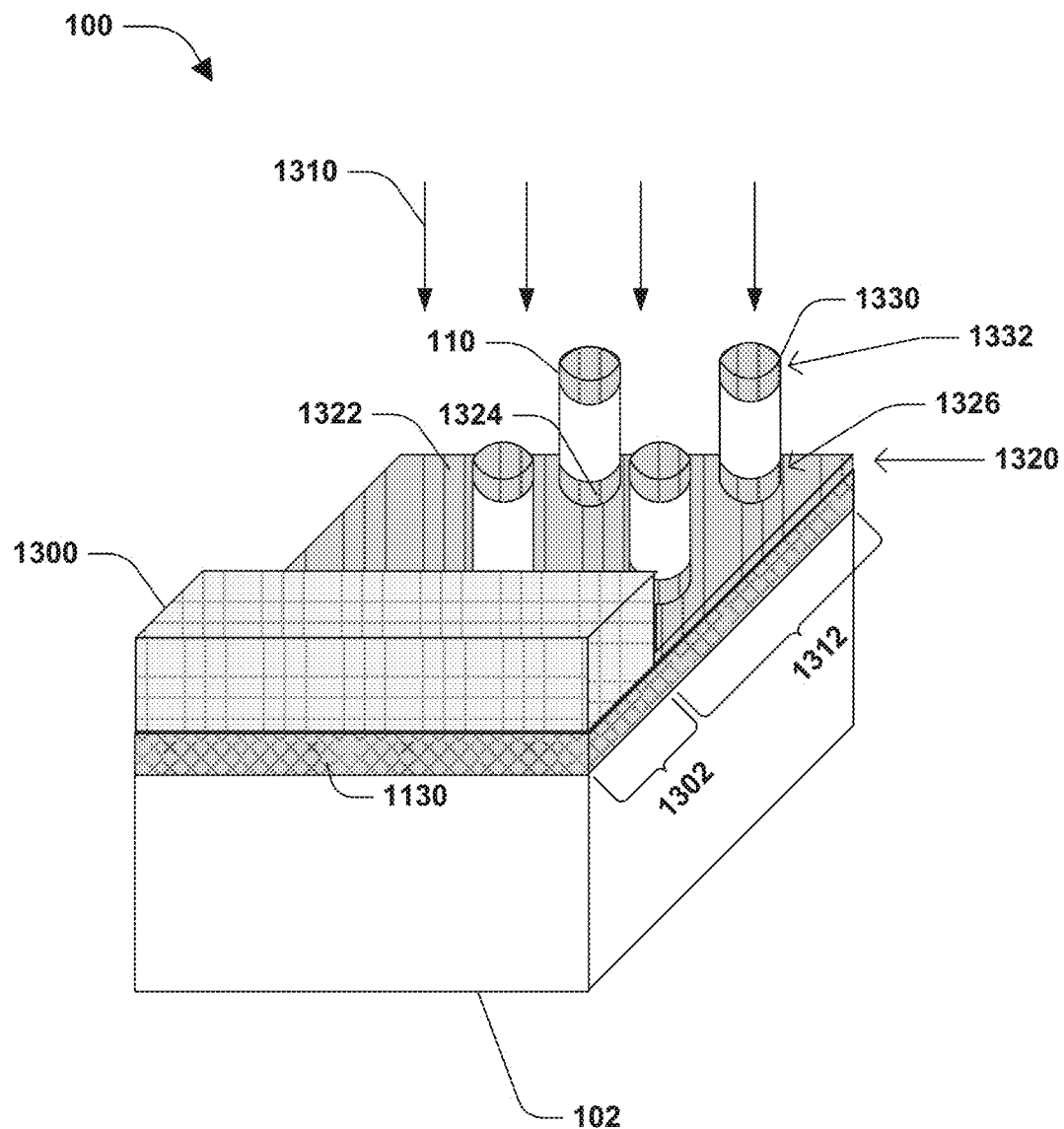
FIG. 13 illustrates a portion of a a semiconductor device, according to an embodiment.

FIG. 13 illustrates the vertical nanowires 110 over the second well region 1130, according to some embodiments. In some embodiments, the following description is the same for the vertical nanowires 110 over the first well region 1040 (e.g., not illustrated in FIGS. 13 to 23). As illustrated in FIG. 13, in some embodiments, a fifth mask region 1300 is formed over a first portion 1302 of the second well region 1130 while a second portion 1312 of the second well region 1130 remains substantially uncovered. The fifth mask region 1300 is formed in any number of ways, such as by deposition, chemical vapor deposition (CVD), or other suitable methods, for example. The fifth mask region 1300 comprises any number of materials, including oxides, silicon oxide, nitrides, silicon nitride, $Si_3N_4$, etc., alone or in combination.

In some embodiments, a first type region 1320 is formed by a first doping 1310 of the vertical nanowires 110 and the second well region 1130. In an embodiment, the first type region 1320 comprises a first conductivity type. In some embodiments, the first conductivity type of the first type region 1320 comprises a p-type material, p+ type material, p++ type material, p-type dopants such as Boron, Gallium, Indium, etc., alone or in combination. In some embodiments, the first conductivity type of the first type region 1320 comprises an n-type material, n+ type material, n++ type material, n-type dopants such as Phosphorous, Arsenic, Antimony, etc., alone or in combination. In some embodiments, the first type region 1320 comprises a source region. In some embodiments, the first type region 1320 comprises a drain region. In an embodiment, the first type region 1320 comprises a first portion 1322 formed on or within the second well region 1130. In an embodiment, a second portion 1324 of the first type region 1320 is formed at a first end 1326 of the vertical nanowires 110. In an embodiment, the second portion 1324 of the first type region 1320 is formed by diffusion from the first portion 1322 of the first type region 1320 into the first end of 1326 of the vertical nanowires 110.

In some embodiments, a second type region 1330 is formed, such as by the first doping 1310 of a second end 1332 of the vertical nanowires 110. According to some embodiments, the second type region 1330 comprises a second conductivity type. In some embodiments, the second conductivity type of the second type region 1330 comprises a p-type material, p+ type material, p++ type material, p-type dopants such as Boron, Gallium, Indium, etc., alone or in combination. In some embodiments, the second conductivity type of the second type region 1330 comprises an n-type material, n+ type material, n++ type material, n-type dopants such as Phosphorous, Arsenic, Antimony, etc., alone or in combination. According to some embodiments, the second type region 1330 comprises a source region. According to some embodiments, the second type region 1330 comprises a drain region.

According to some embodiments, the first conductivity type of the first type region 1320 is the same or substantially similar to the second conductivity type of the second type region 1330. In some embodiments, the first conductivity type of the first type region 1320 and the second conductivity type of the second type region 1330 comprises a p-type material, p+ type material, p++ type material, p-type dopants such as Boron, Gallium, Indium, etc., alone or in combination. In some embodiments, the first conductivity type of the first type region 1320 and the second conductivity type of the second type region 1330 comprises an n-type material, n+ type material, n++ type material, n-type dopants such as Phosphorous, Arsenic, Antimony, etc., alone or in combination.

Figure 14:
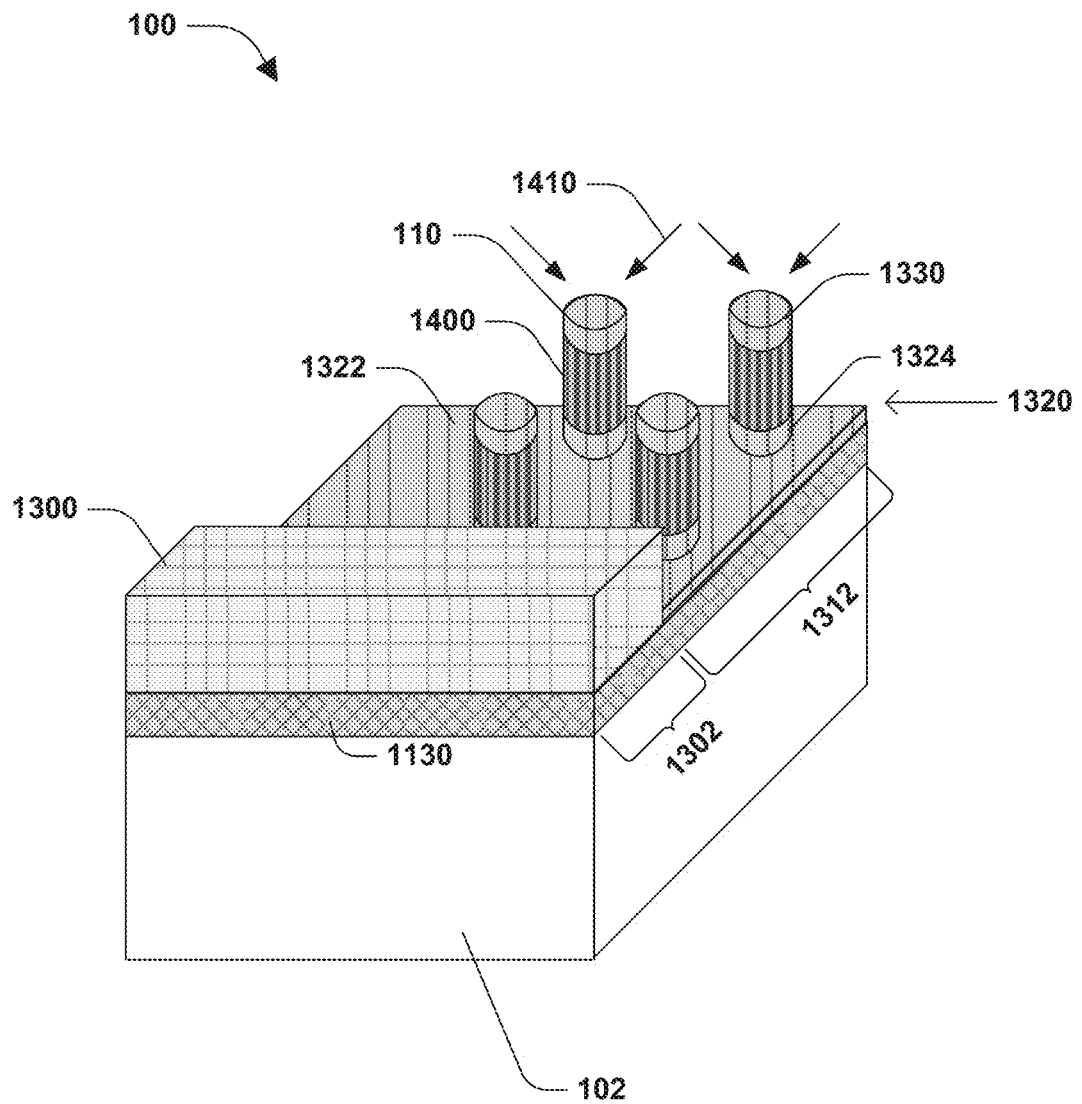
FIG. 14 illustrates a portion of a semiconductor device, according to an embodiment.

Turning to FIG. 14, in some embodiments, a channel region 1400 is formed, such as by a second doping 1410 of the vertical nanowires 110. In some embodiments, the channel region 1400 is formed by a tilted or angled doping process, in which dopants are imparted to the vertical nanowires 110 at a non-vertical angle relative to the second well region 1130 from which the vertical nanowires 110 project. In some embodiments, the channel region 1400 extends between the first type region 1320 and the second type region 1330.

According to some embodiments, the channel region 1400 comprises a third conductivity type. In some embodiments, the third conductivity type of the channel region 1400 comprises a p-type material, p+ type material, p++ type material, p-type dopants such as Boron, Gallium, Indium, etc., alone or in combination. In some embodiments, the third conductivity type of the channel region 1400 comprises an n-type material, n+ type material, n++ type material, n-type dopants such as Phosphorous, Arsenic, Antimony, etc., alone or in combination. In some embodiments, the third conductivity type of the channel region 1400 is the same or substantially similar to the first conductivity type of the first type region 1320 and the second conductivity type of the second type region 1330. In some embodiments, the third conductivity type of the channel region 1400 is different from the first conductivity type of the first type region 1320 and the second conductivity type of the second type region 1330.

Figure 15:
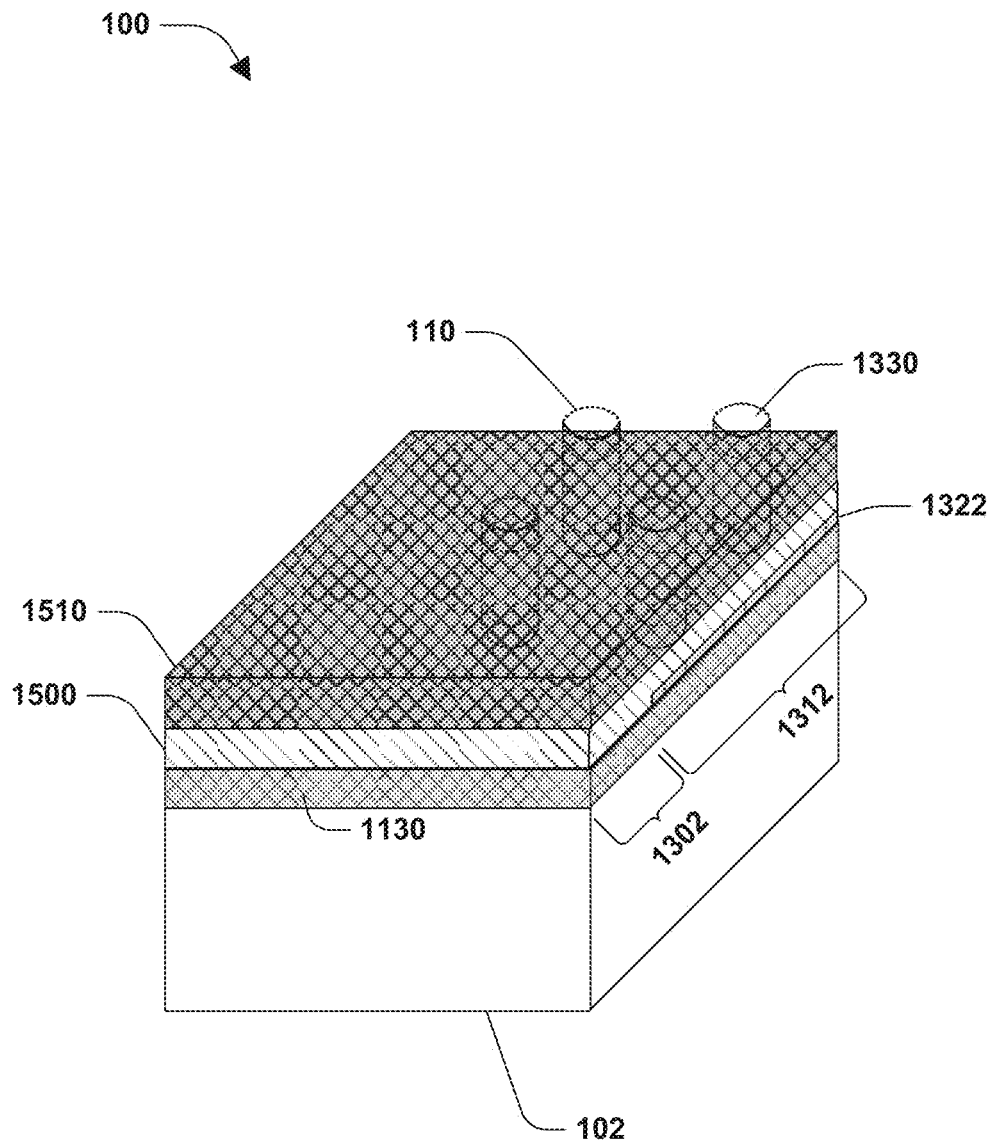
FIG. 15 illustrates a portion of a semiconductor device, according to an embodiment.

Turning to FIG. 15, according to some embodiments, the fifth mask region 1300 is removed from the first portion 1302 of the second well region 1130, such as by etching. In some embodiments, a first dielectric region 1500 is formed on the first portion 1322 of the first type region 1320 and on the first portion 1302 of the second well region 1130. In some embodiments, the first dielectric region 1500 comprises a dielectric material with a relatively high dielectric constant. In some embodiments, the first dielectric region 1500 comprises a standard dielectric material with a medium or low dielectric constant, such as $SiO_2$. The first dielectric region 1500 is formed in any number of ways, such as by thermal growth, chemical growth, atomic layer deposition (ALD), chemical vapor deposition (CVD), plasma-enhanced chemical vapor deposition (PECVD), etc.

Figure 24:
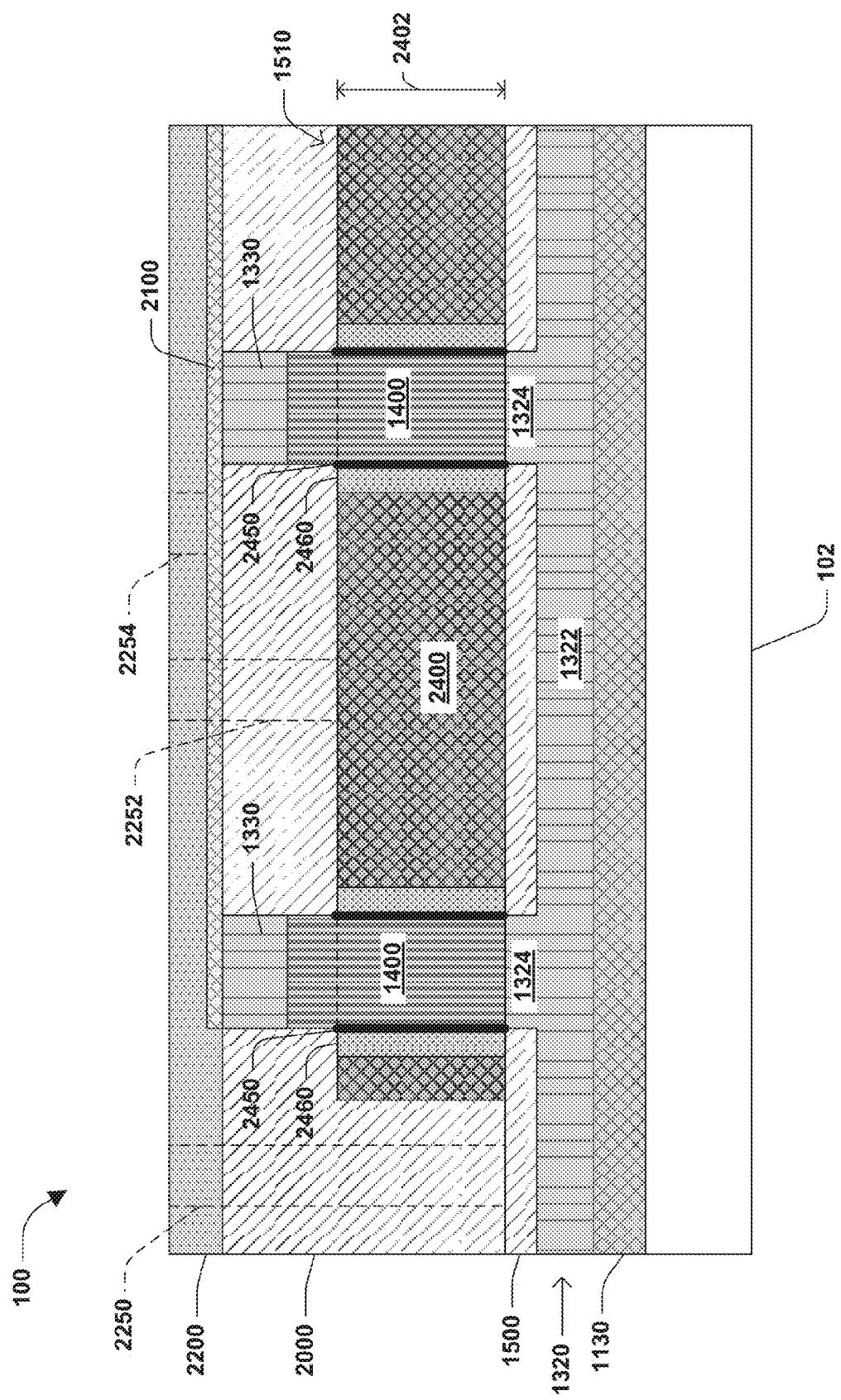
FIG. 24 illustrates a semiconductor device, according to an embodiment.

According to some embodiments, a gate region 1510 is formed over the first dielectric region 1500. In some embodiments, the gate region 1510, illustrated in more detail in FIG. 24, is formed surrounding the vertical nanowires 110. In some embodiments, the gate region 1510 surrounds the channel region 1400, with a portion of the vertical nanowires 110, such as the second type region 1330, extending upwardly from the gate region 1510.

Figure 16:
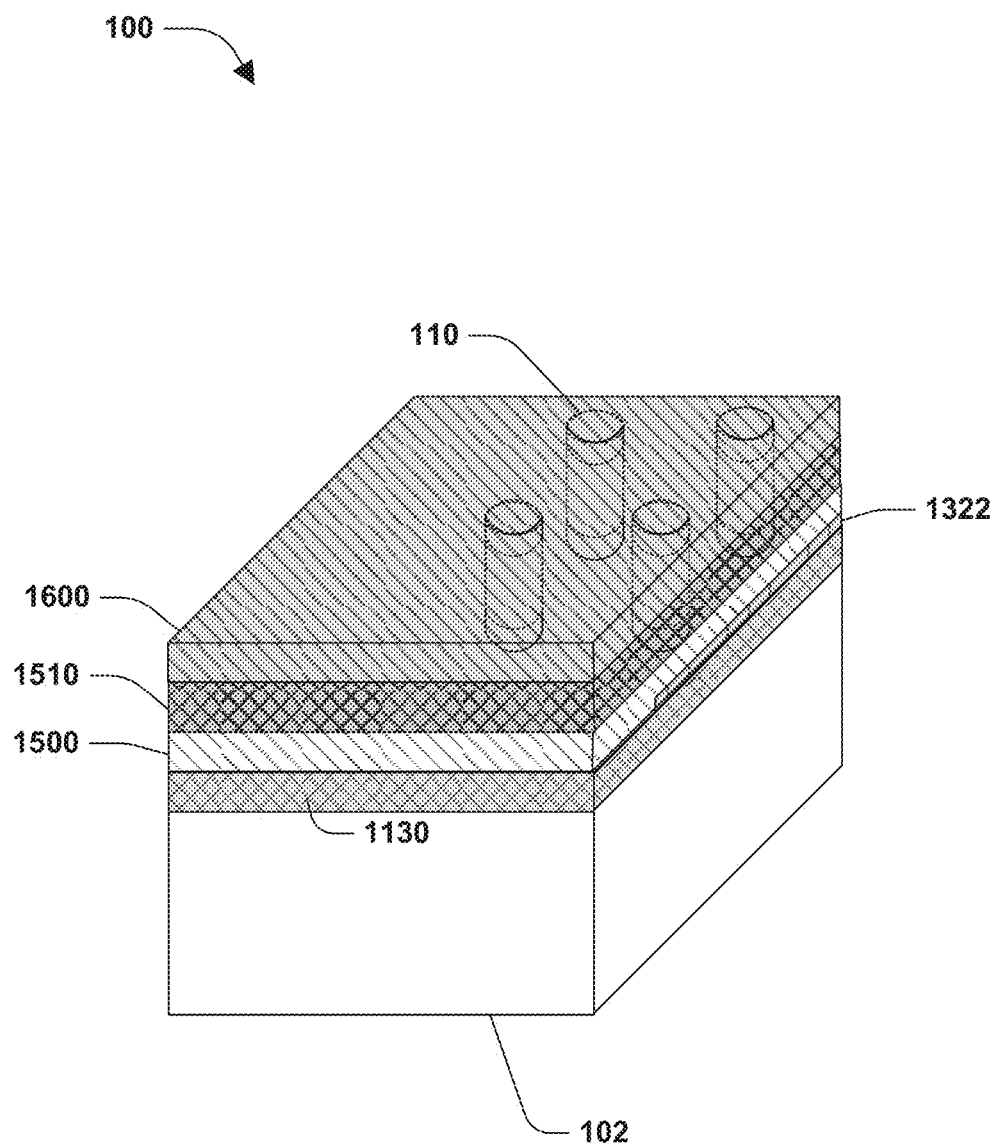
FIG. 16 illustrates a portion of a semiconductor device, according to an embodiment.

Turning to FIG. 16, in some embodiments, a sixth mask region 1600 is formed over the gate region 1510. The sixth mask region 1600 is formed in any number of ways, such as by deposition, chemical vapor deposition (CVD), or other suitable methods, for example. The sixth mask region 1600 comprises any number of materials, including oxides, silicon oxide, nitrides, silicon nitride, $Si_3N_4$, etc., alone or in combination. In some embodiments, the sixth mask region 1600 substantially covers the vertical nanowires 110, including the second type region 1330.

Figure 17:
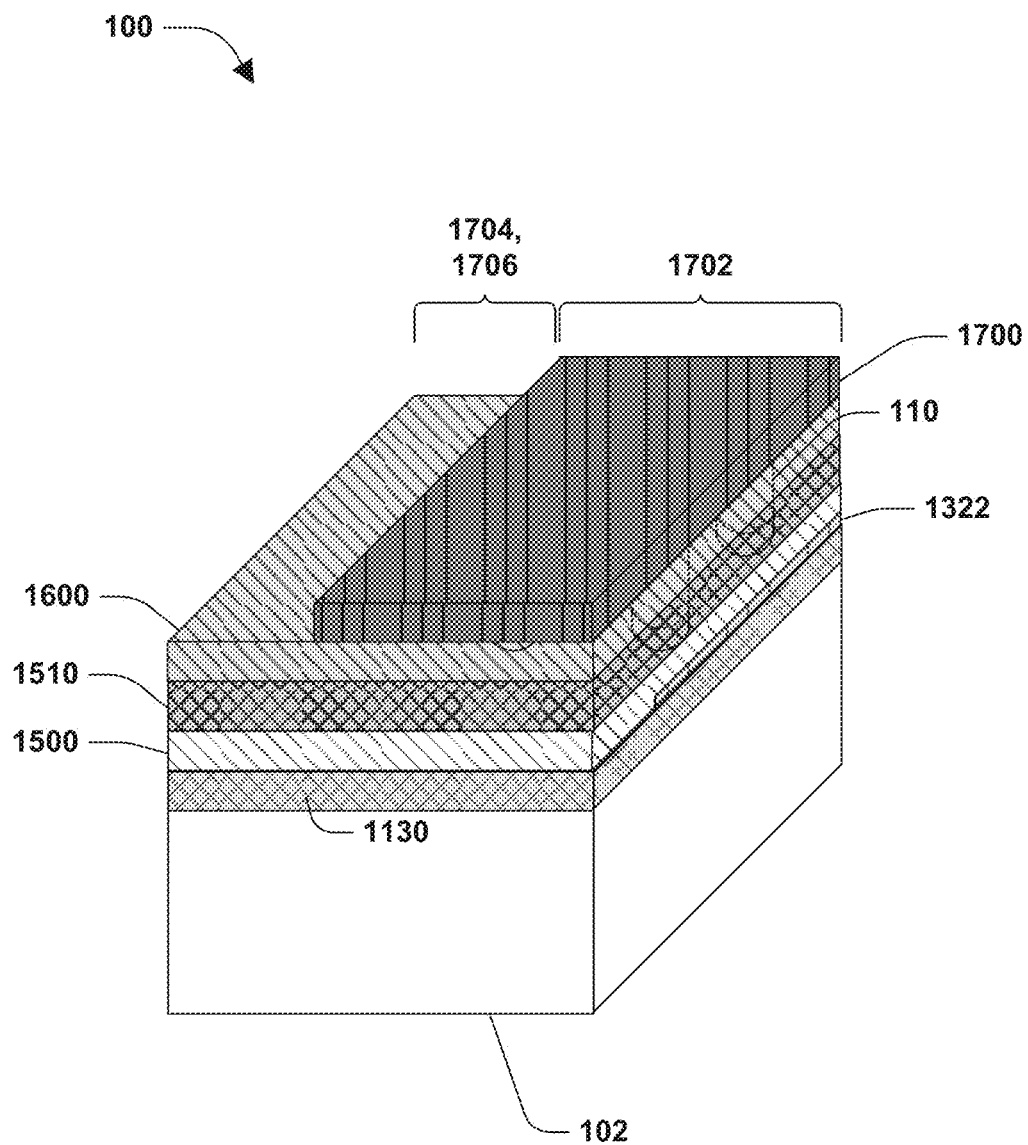
FIG. 17 illustrates a portion of a semiconductor device, according to an embodiment.

Turning to FIG. 17, in some embodiments, a gate mask region 1700 is formed over a first portion 1702 of the sixth mask region 1600. In an embodiment, the gate mask region 1700 is formed over the vertical nanowires 110. The gate mask region 1700 is formed in any number of ways, such as by deposition, chemical vapor deposition (CVD), photoresist, or other suitable methods, for example. The gate mask region 1700 comprises any number of materials, including oxides, silicon oxide, nitrides, silicon nitride, $Si_3N_4$, photoresist, etc., alone or in combination. In some embodiments, a second portion 1704 of the sixth mask region 1600 remains substantially uncovered by the gate mask region 1700.

Figure 18:
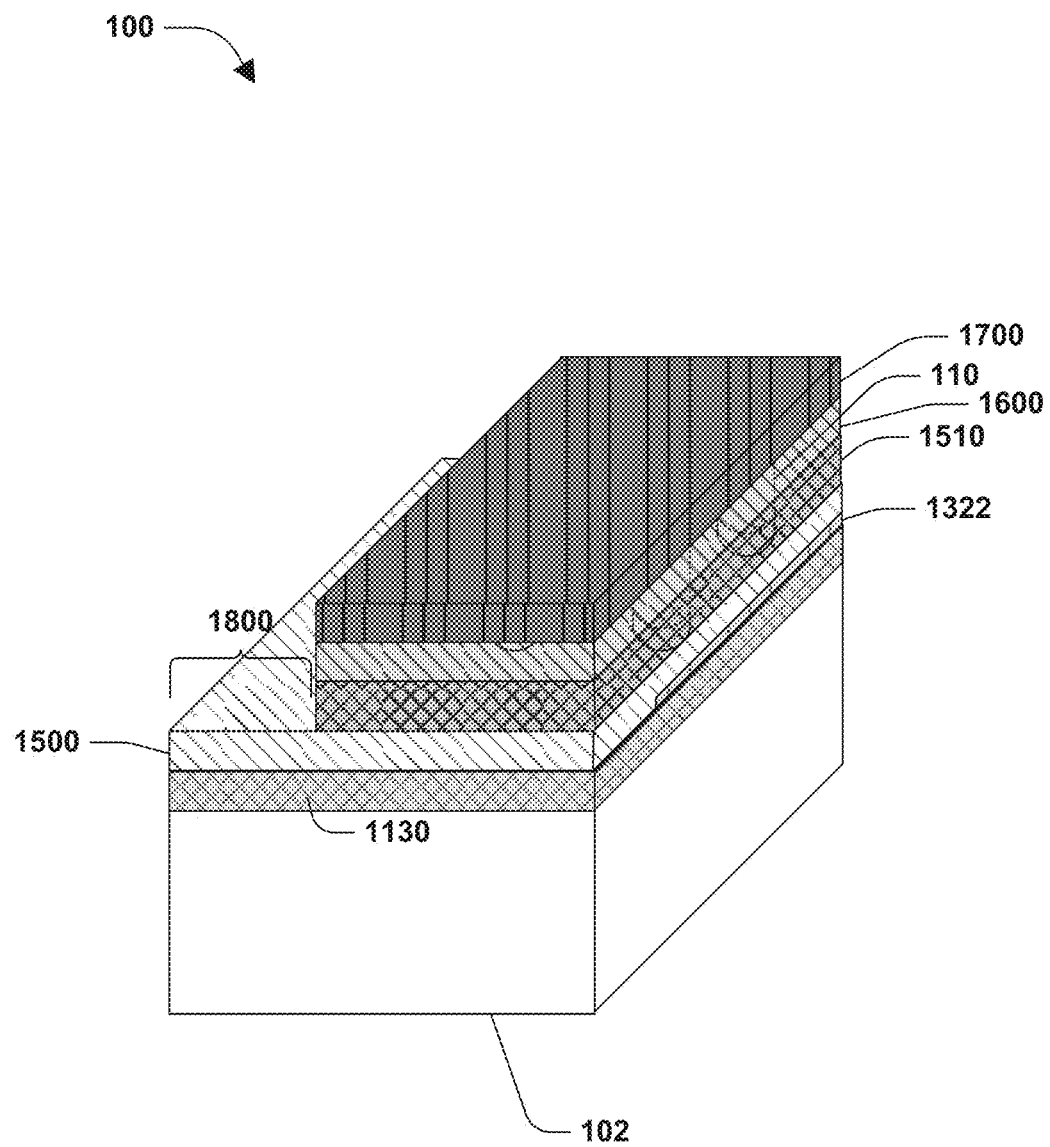
FIG. 18 illustrates a portion of a semiconductor device, according to an embodiment.

Turning to FIG. 18, in some embodiments, the second portion 1704 (e.g., illustrated in FIG. 17) of the sixth mask region 1600 is removed, such as by etching. In some embodiments, a first portion 1706 (e.g., illustrated in FIG. 17) of the gate region 1510 is removed, such as by etching. In an embodiment, following the removal of the second portion 1704 of the sixth mask region 1600 and the first portion 1706 of the gate region 1510, a first portion 1800 of the first dielectric region 1500 is substantially exposed and uncovered.

Figure 19:
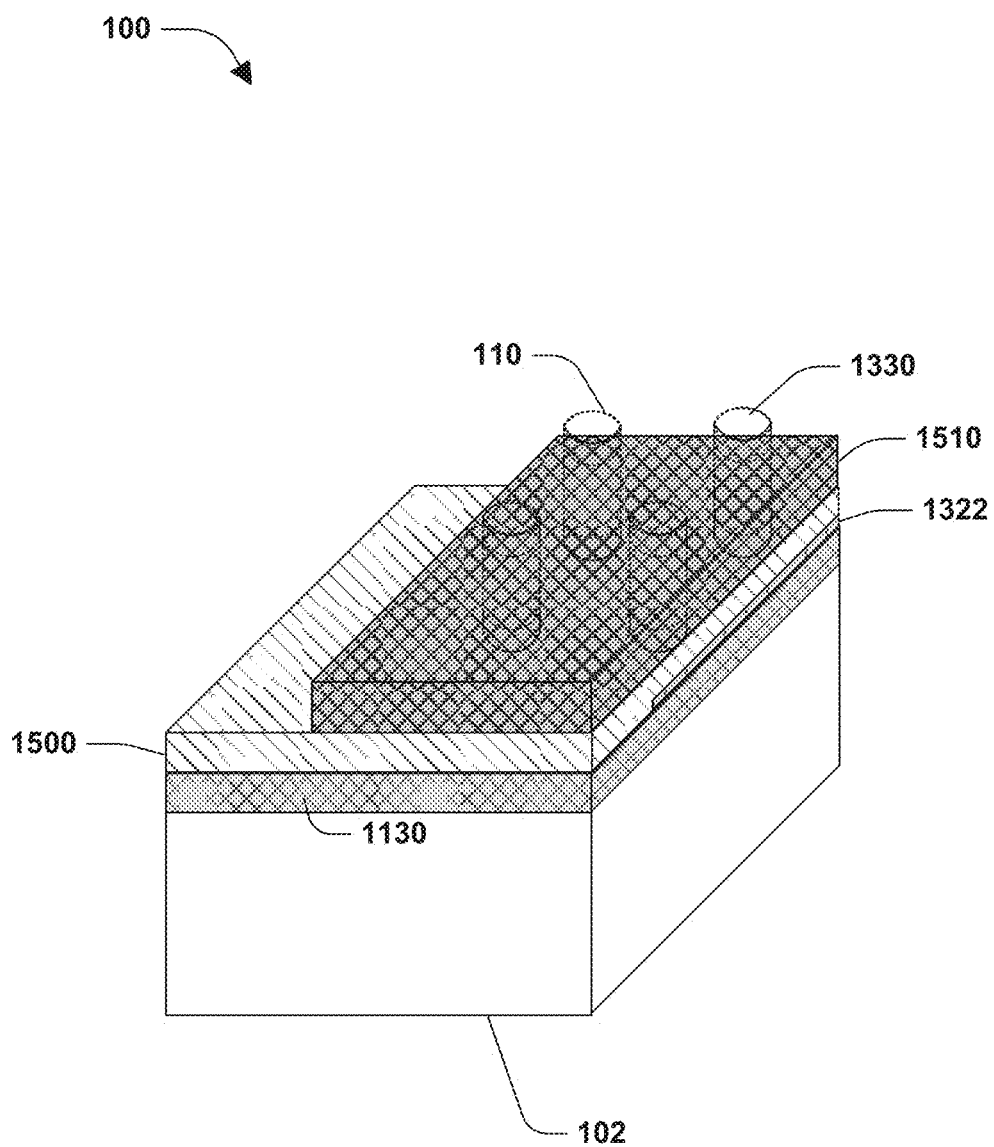
FIG. 19 illustrates a portion of a semiconductor device, according to an embodiment.

Turning to FIG. 19, in some embodiments, the sixth mask region 1600 and the gate mask region 1700 are removed, such as by etching. In some embodiments, following removal of the sixth mask region 1600 and the gate mask region 1700, the gate region 1510 and portions of the vertical nanowires 110, such as the second type region 1330, are exposed.

Figure 20:
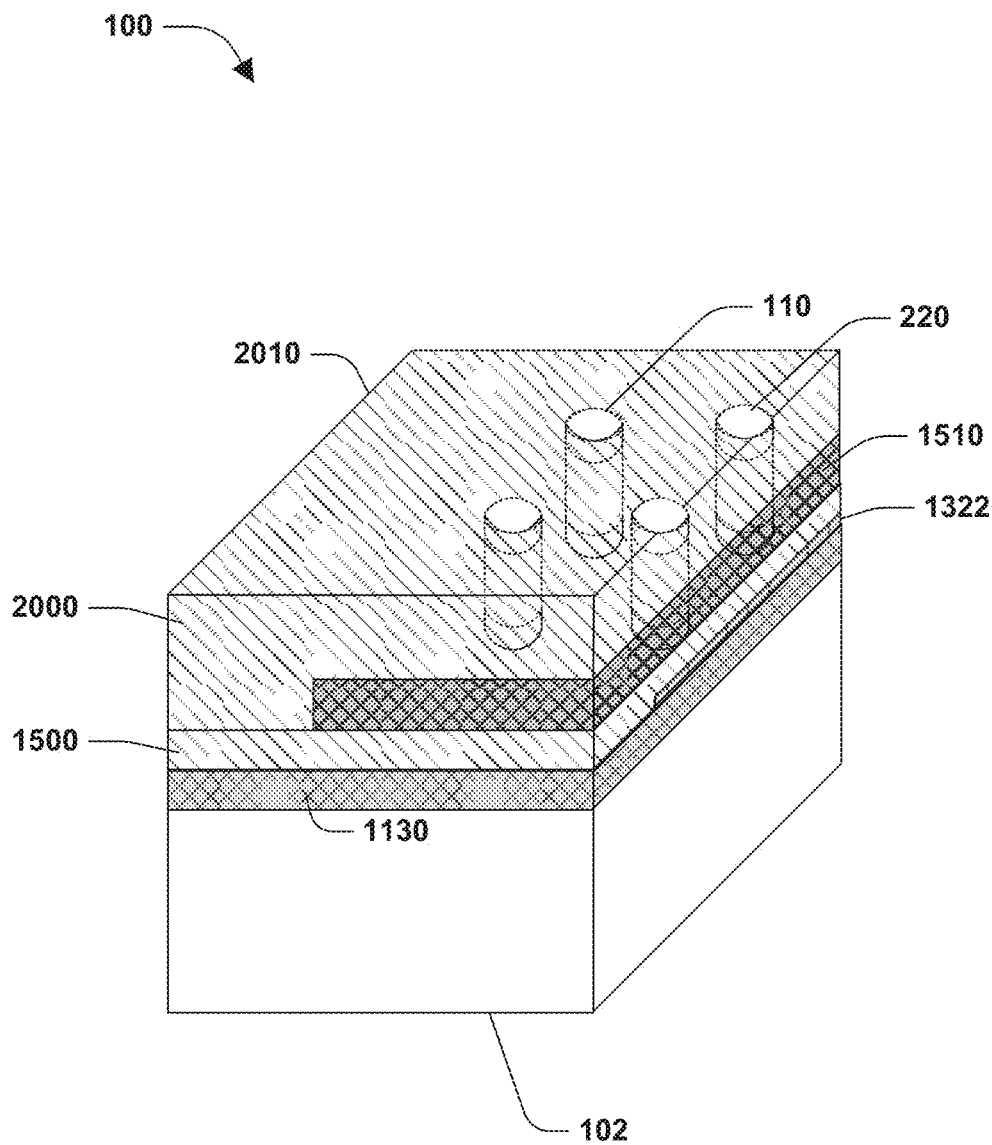
FIG. 20 illustrates a portion of a semiconductor device, according to an embodiment.

Turning to FIG. 20, according to some embodiments, a second dielectric region 2000 is formed on the gate region 1510 and on the first dielectric region 1500. In some embodiments, the second dielectric region 2000 comprises a dielectric material with a relatively high dielectric constant. In some embodiments, the second dielectric region 2000 comprises a standard dielectric material with a medium or low dielectric constant, such as $SiO_2$. The second dielectric region 2000 is formed in any number of ways, such as by thermal growth, chemical growth, atomic layer deposition (ALD), chemical vapor deposition (CVD), plasma-enhanced chemical vapor deposition (PECVD), etc. In some embodiments, the second dielectric region 2000 is planarized, such that a top surface 2010 of the second dielectric region 2000 is substantially co-planar with respect to the top surfaces 220 of the vertical nanowires 110.

Figure 21:
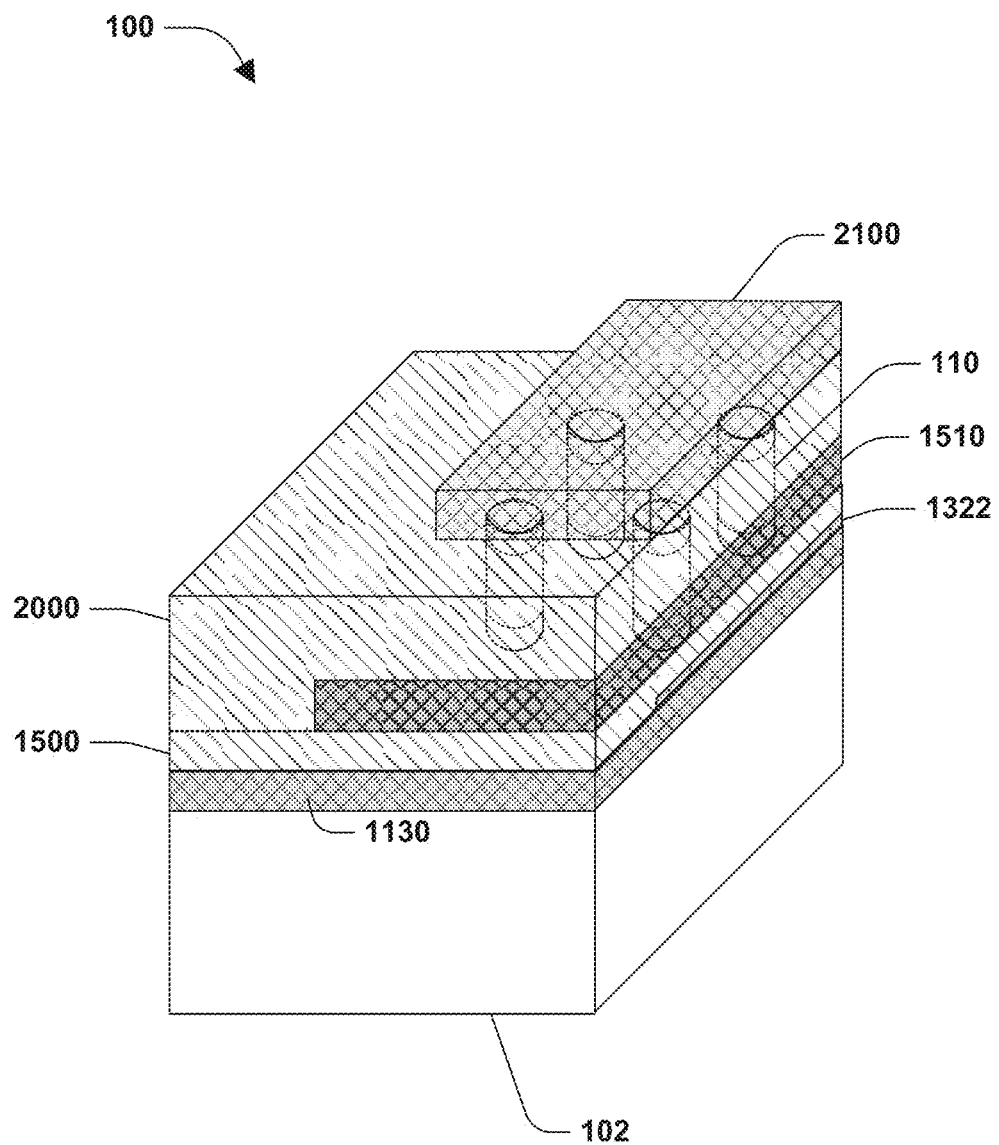
FIG. 21 illustrates a portion of a semiconductor device, according to an embodiment.

Turning to FIG. 21, in an embodiment, a silicide layer 2100 is formed. The silicide layer 2100 is formed in any number of ways, such as by deposition, for example, or by successive deposition of amorphous silicon and a metal. In some embodiments, the silicide layer 2100 is formed on the second dielectric region 2000 over the top surfaces 220 of the vertical nanowires 110. According to some embodiments, the silicide layer 2100 is formed by depositing a layer of metal, such as nickel, platinum, tantalum, titanium, cobalt, tungsten, erbium, etc., alone or in combination. In an embodiment, silicide layer 2100 is heated or annealed, such that the metal in silicide layer 2100 reacts with silicon in the second type region 1330. In some embodiments, this heating or annealing of the silicide layer 2100 forms a silicide layer that is formed from the reaction between the silicon in the second type region 1330 and the layer of metal of the silicide layer 2100. Accordingly, in some embodiments, the silicide layer 2100 is annealed to the second type region 1330.

Figure 22:
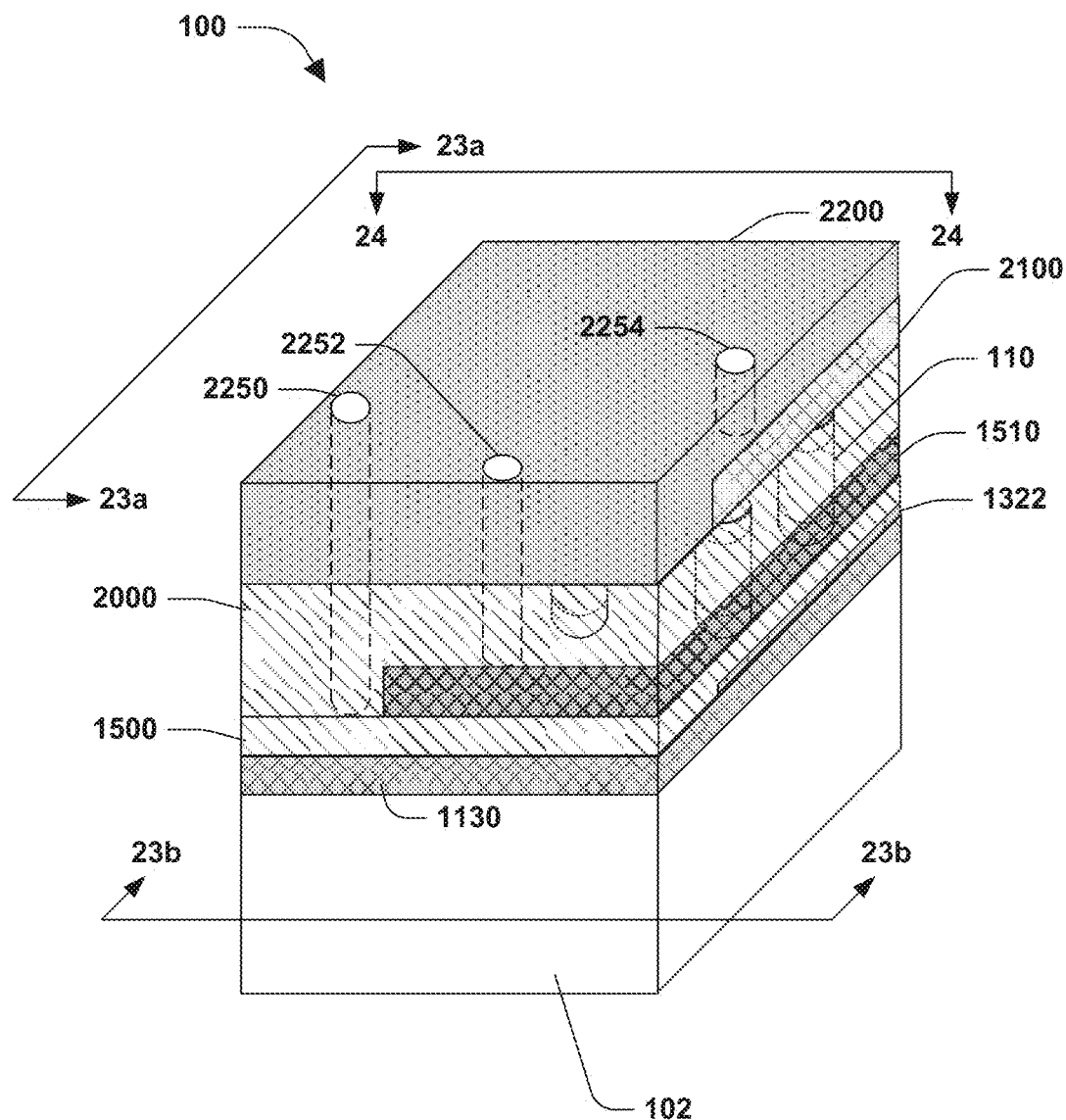
FIG. 22 illustrates a portion of a semiconductor device, according to an embodiment.

Turning to FIG. 22, in some embodiments, an interlayer dielectric region 2200 is formed over the second dielectric region 2000 and over the silicide layer 2100. In some embodiments, the interlayer dielectric region 2200 comprises a dielectric material with a relatively high dielectric constant. In some embodiments, the interlayer dielectric region 2200 comprises a standard dielectric material with a medium or low dielectric constant, such as $SiO_2$. The interlayer dielectric region 2200 is formed in any number of ways, such as by thermal growth, chemical growth, atomic layer deposition (ALD), chemical vapor deposition (CVD), plasma-enhanced chemical vapor deposition (PECVD), etc.

Figure 23A:
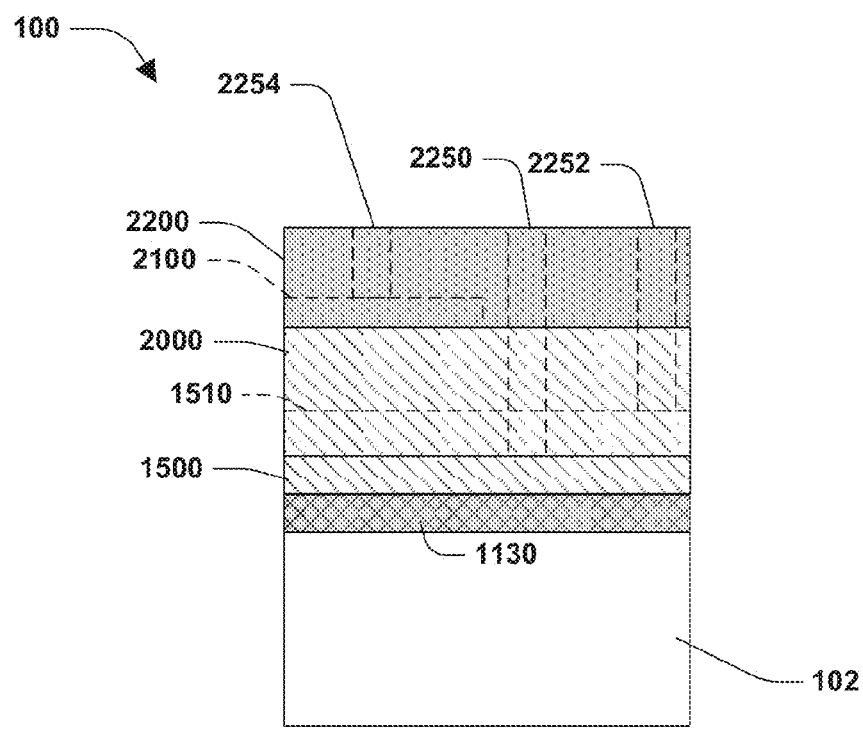
FIG. 23a illustrates a portion of a semiconductor device, according to an embodiment.
Figure 23B:
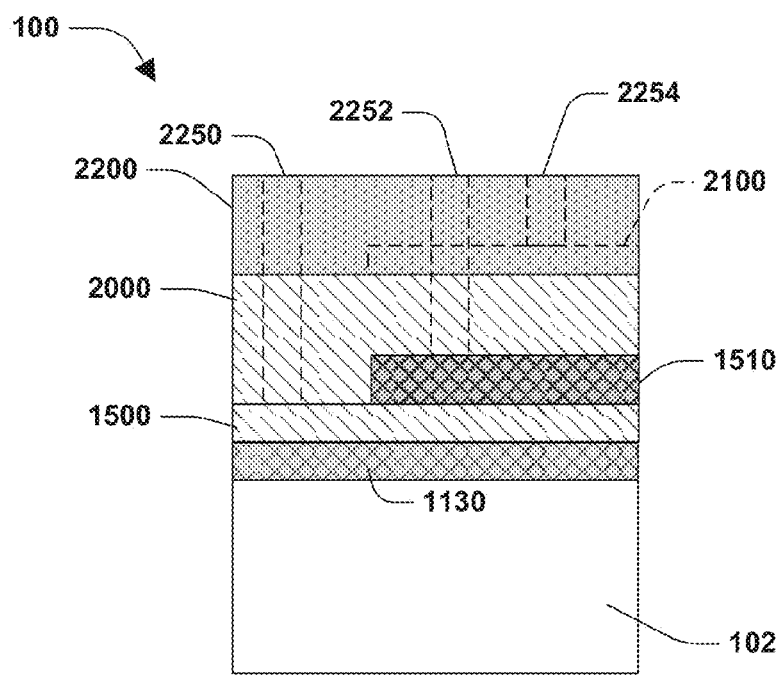
FIG. 23b illustrates a portion of a semiconductor device, according to an embodiment.

Turning to FIGS. 22, 23a, and 23b, according to some embodiments, a first type region contact 2250, a gate region contact 2252 and a second type region contact 2254 are formed. FIG. 23a is a sectional view looking in to the embodiment of FIG. 22 from a perspective indicated by line 23a-23a. FIG. 23b is a sectional view looking in to the embodiment of FIG. 22 from a perspective indicated by line 23b-23b.

In an embodiment, the first type region contact 2250, the gate region contact 2252, and the second type region contact 2254 comprise a metal material. In some embodiments, the first type region contact 2250 is formed within an opening in the interlayer dielectric region 2200. In an embodiment, the first type region contact 2250 is formed in contact with the first portion 1322 of the first type region 1320. In an embodiment, the gate region contact 2252 is formed within an opening in the interlayer dielectric region 2200. In an embodiment, the gate region contact 2252 is formed in contact with a gate electrode (e.g., illustrated in FIG. 24) of the gate region 1510. In some embodiments, the second type region contact 2254 is formed within an opening in the interlayer dielectric region 2200. In an embodiment, the second type region contact 2254 is formed in contact with the silicide layer 2100.

FIG. 24 is a cross-sectional view of the embodiment of FIG. 22 taken along lines 24-24 in FIG. 22. In some embodiments, the gate region 1510 comprises a gate electrode 2400. The gate electrode 2400, as part of the gate region 1510, is formed in any number of ways, such as by atomic layer deposition (ALD), sputtering, thermal evaporation, e-beam evaporation, chemical vapor deposition (CVD), etc., for example. According to some embodiments, the gate electrode 2400 of the gate region 1510 is formed over the first dielectric region 1500 and surrounding the channel region 1400. In some embodiments, the gate electrode 2400 comprises a conductive material, such as TiN, TaN, TaC, aluminum, copper, polysilicon, etc., alone or in combination. In some embodiments, a gate electrode length 2402 of the gate electrode 2400 is less than about 10 nm. According to some embodiments, the first dielectric region 1500 is between the gate electrode 2400 and the first portion 1322 of the first type region 1320. In an embodiment, the first dielectric region 1500 surrounds the second portion 1324 of the first type region 1320. In some embodiments, the second dielectric region 2000 is formed on the gate electrode 2400.

In some embodiments, the gate region 1510 comprises an interlayer dielectric layer 2450. In an embodiment, the interlayer dielectric layer 2450 is formed over the first dielectric region 1500 and surrounding the channel region 1400. In some embodiments, the interlayer dielectric layer 2450 is in closer proximity to the channel region 1400 than the gate electrode 2400. The interlayer dielectric layer 2450 is formed in any number of ways, such as by thermal growth, chemical growth, atomic layer deposition (ALD), chemical vapor deposition (CVD), plasma-enhanced chemical vapor deposition (PECVD), thermal or chemical growth, oxidation, etc. In some embodiments, the interlayer dielectric layer 2450 comprises a standard dielectric material with a medium or low dielectric constant, such as $SiO_2$.

In some embodiments, the gate region 1510 comprises a high-k dielectric layer 2460. In an embodiment, the high-k dielectric layer 2460 is formed over the first dielectric region 1500 and surrounding the channel region 1400 and the interlayer dielectric layer 2450. In some embodiments, the high-k dielectric layer 2460 is in closer proximity to the channel region 1400 than the gate electrode 2400. The high-k dielectric layer 2460 is formed in any number of ways, such as by thermal growth, chemical growth, atomic layer deposition (ALD), chemical vapor deposition (CVD), plasma-enhanced chemical vapor deposition (PECVD), etc. In some embodiments, the high-k dielectric layer 2460 comprises a dielectric material with a relatively high dielectric constant.

In some embodiments the gate dielectric comprises a multilayer structure such as oxide-nitride-oxide.

Figure 25:
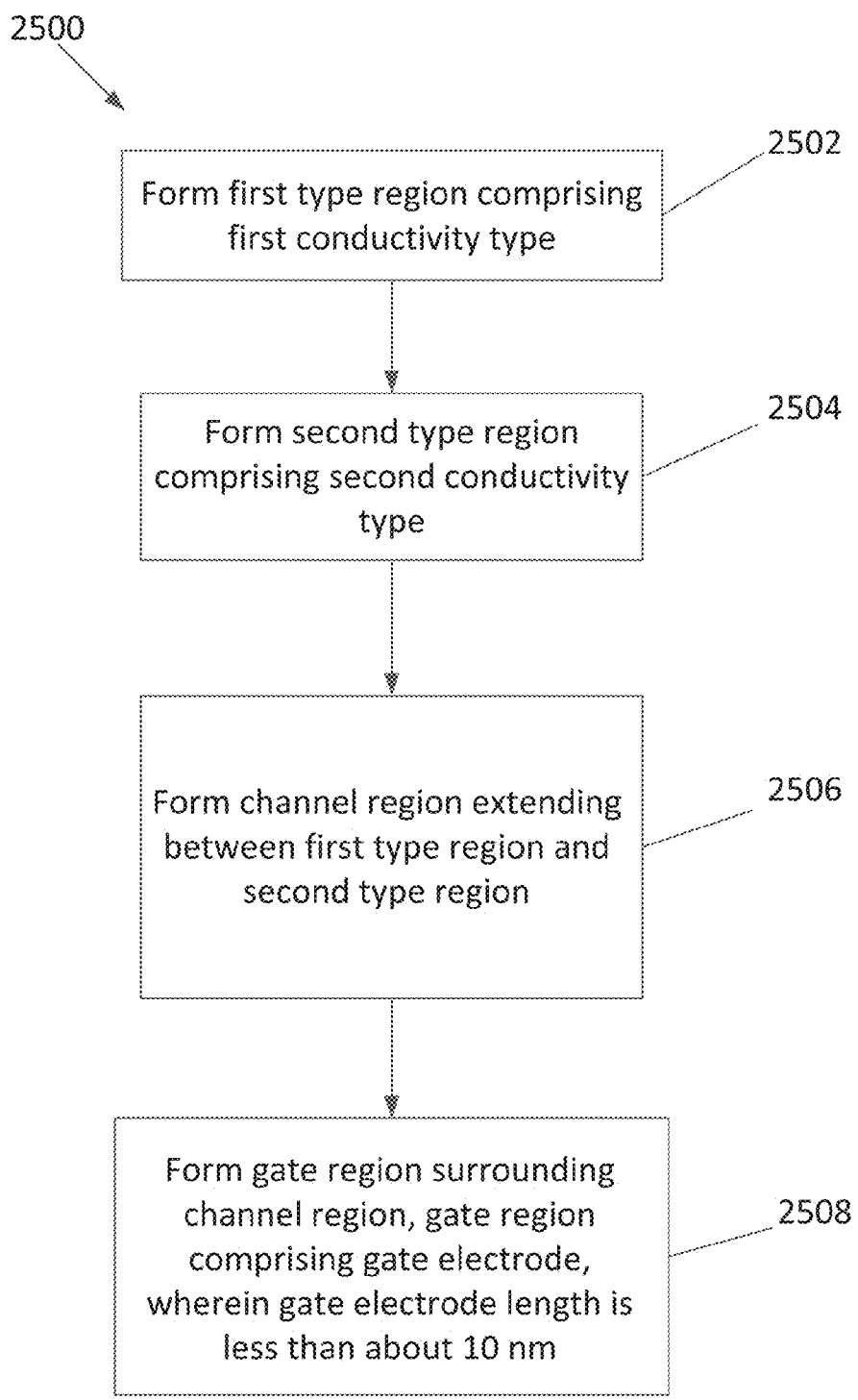
FIG. 25 illustrates a method of forming a semiconductor device, according to an embodiment.

An example method 2500 of forming a semiconductor device, such as semiconductor device 100 according to some embodiments, is illustrated in FIG. 25. At 2502, a first type region 1320 is formed comprising a first conductivity type. At 2504, a second type region 1330 is formed comprising a second conductivity type. At 2506, a channel region 1400 is formed extending between the first type region 1320 and the second type region 1330. In At 2508, a gate region 1510 is formed surrounding the channel region 1400. In an embodiment, the gate region 1510 comprises a gate electrode 2400, wherein a gate electrode length 2402 of the gate electrode 2400 is less than about 10 nm.

Figure 26:
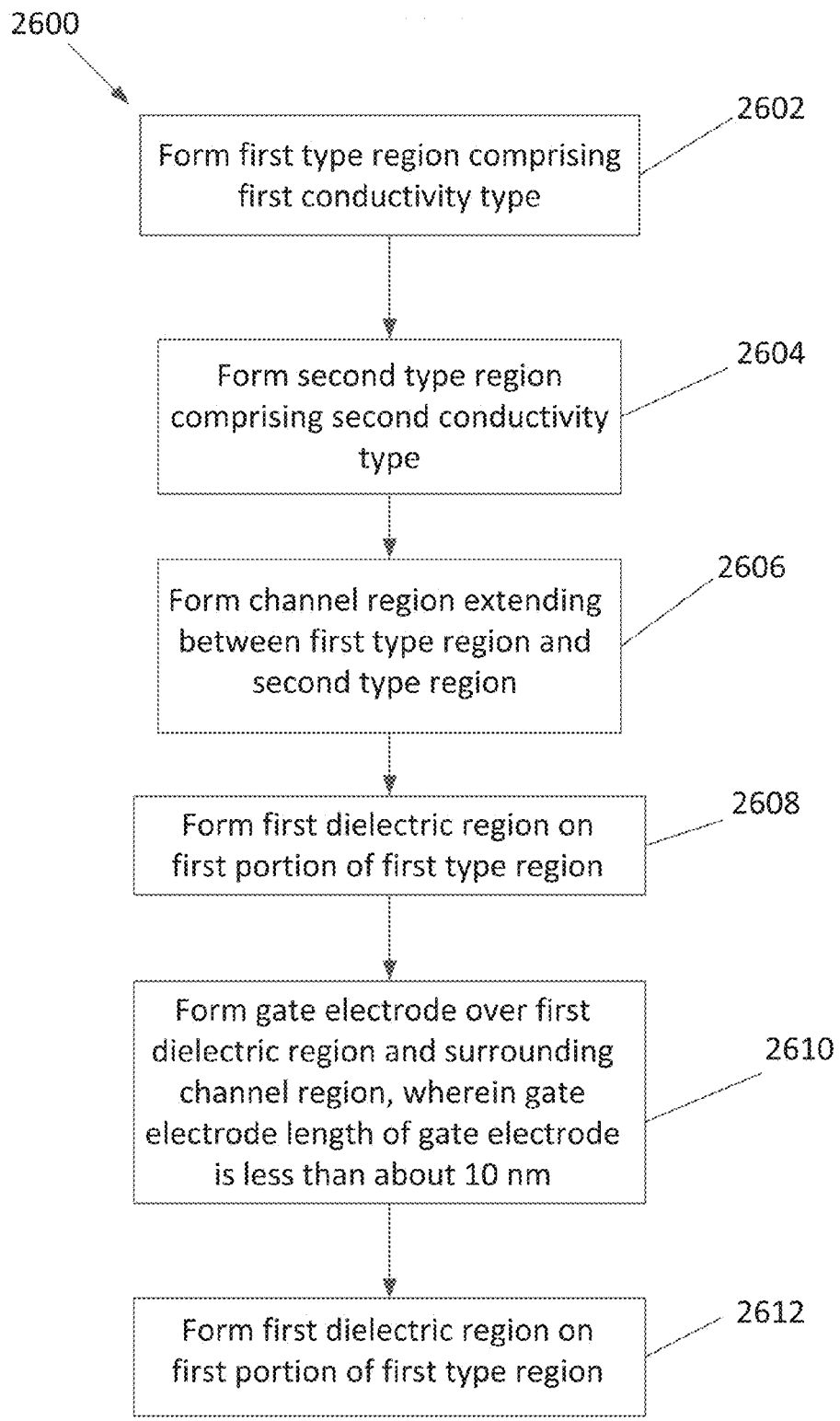
FIG. 26 illustrates a method of forming a semiconductor device, according to an embodiment.

An example method 2600 of forming a semiconductor device, such as semiconductor device 100 according to some embodiments, is illustrated in FIG. 26. At 2602, a first type region 1320 is formed comprising a first conductivity type. At 2604, a second type region 1330 is formed comprising a second conductivity type. At 2606, a channel region 1400 is formed extending between the first type region 1320 and the second type region 1330. At 2608, a first dielectric region 1500 is formed on a first portion 1322 of the first type region 1320. At 2610, a gate electrode 2400 is formed over the first dielectric region 1500 and surrounding the channel region 1400, wherein a gate electrode length 2402 of the gate electrode 2400 is less than about 10 nm. At 2612, a second dielectric region is formed on the gate electrode 2400.

According to some embodiments, the semiconductor device 100 comprises the channel region 1400 surrounded by the gate electrode 2400 of the gate region 1510. In some embodiments, the gate electrode length 2402 of the gate electrode 2400 is less than about 10 nm. According to some embodiments, control of short channel effects is improved even at the relatively short gate electrode length 2402 of less than about 10 nm. In some embodiments, mobility of the semiconductor device 100 is also improved.

In an embodiment, a semiconductor device comprises a first type region comprising a first conductivity type. In an embodiment, the semiconductor device comprises a second type region comprising a second conductivity type. In an embodiment, the semiconductor device comprises a channel region extending between the first type region and the second type region. In an embodiment, the semiconductor device comprises a gate region surrounding the channel region, the gate region comprising a gate electrode, wherein a gate electrode length of the gate electrode is less than about 10 nm.

In an embodiment, a method of forming a semiconductor device comprises forming a first type region comprising a first conductivity type. In an embodiment, the method comprises forming a second type region comprising a second conductivity type. In an embodiment, the method comprises forming a channel region extending between the first type region and the second type region. In an embodiment, the method comprises forming a gate region surrounding the channel region, the gate region comprising a gate electrode, wherein a gate electrode length of the gate electrode is less than about 10 nm.

In an embodiment, a method of forming a semiconductor device comprises forming a first type region comprising a first conductivity type. In an embodiment, the method comprises forming a second type region comprising a second conductivity type. In an embodiment, the method comprises forming a channel region extending between the first type region and the second type region. In an embodiment, the method comprises forming a first dielectric region on a first portion of the first type region. In an embodiment, the method comprises forming a gate electrode over the first dielectric region and surrounding the channel region, wherein a gate electrode length of the gate electrode is less than about 20 nm. In an embodiment, the method comprises forming a second dielectric region on the gate electrode.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first region and a second region generally correspond to region A and region B or two different or two identical regions or the same type region.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device comprising:
   a first type region comprising a first conductivity type;
   a second type region comprising a second conductivity type;
   a channel region extending between the first type region and the second type region; and
   a gate region surrounding the channel region, the gate region comprising a gate electrode, wherein a gate electrode length of the gate electrode is less than about 10 nm.

2. The semiconductor device of claim 1, comprising a first dielectric region between the gate electrode and a first portion of the first type region.

3. The semiconductor device of claim 2, wherein the first dielectric region surrounds a second portion of the first type region.

4. The semiconductor device of claim 1, wherein the first type region comprises a source region and the second type region comprises a drain region.

5. The semiconductor device of claim 1, wherein the first type region comprises a drain region and the second type region comprises a source region.

6. The semiconductor device of claim 1, wherein the first conductivity type of the first type region is the same as the second conductivity type of the second type region.

7. A method of forming a semiconductor device, the method comprising:
   forming a first type region comprising a first conductivity type;
   forming a second type region comprising a second conductivity type;
   forming a channel region extending between the first type region and the second type region; and
   forming a gate region surrounding the channel region, the gate region comprising a gate electrode, wherein a gate electrode length of the gate electrode is less than about 10 nm.

8. The method of claim 7, comprising forming vertical nanowires over a substrate region prior to forming the first type region comprising the first conductivity type.

9. The method of claim 8, comprising forming a first oxide region surrounding the vertical nanowires.

10. The method of claim 8, comprising forming a first mask portion of a first mask region over a first portion of the vertical nanowires and forming a second mask portion of the first mask region over a second portion of the vertical nanowires.

11. The method of claim 10, comprising removing a third portion of the vertical nanowires that is not covered by the first mask portion or the second mask portion of the first mask region.

12. The method of claim 10, comprising:
   forming a third mask region over the second portion of the vertical nanowires and over a second portion of the substrate region; and
   doping a first portion of the substrate region such that the first portion of the substrate region comprises the first conductivity type.

13. The method of claim 12, comprising:
   forming a fourth mask region over the first portion of the vertical nanowires and over the first portion of the substrate region; and
   doping the second portion of the substrate region such that the second portion of the substrate region comprises the second conductivity type, the second conductivity type opposite the first conductivity type.

14. The method of claim 7, comprising forming a first dielectric region on a first portion of the first type region.

15. A method of forming a semiconductor device, the method comprising:
   forming a first type region comprising a first conductivity type;
   forming a second type region comprising a second conductivity type;
   forming a channel region extending between the first type region and the second type region;
   forming a first dielectric region on a first portion of the first type region;
   forming a gate electrode over the first dielectric region and surrounding the channel region, wherein a gate electrode length of the gate electrode is less than about 10 nm; and
   forming a second dielectric region on the gate electrode.

16. The method of claim 15, comprising forming a silicide layer over the second dielectric region.

17. The method of claim 16, comprising annealing the silicide layer to the second type region.

18. The method of claim 16, comprising forming a second type region contact in contact with the silicide layer.

19. The method of claim 15, comprising forming a gate region contact in contact with the gate electrode.

20. The method of claim 15, comprising forming a first type region contact in contact with the first type region.

\* \* \* \* \*